US010700300B2

(12) United States Patent
Wallikewitz et al.

(10) Patent No.: US 10,700,300 B2
(45) Date of Patent: Jun. 30, 2020

(54) ORGANIC LIGHT-EMITTING DIODE INCLUDING AN ELECTRON TRANSPORT LAYER STACK COMPRISING DIFFERENT LITHIUM COMPOUNDS AND ELEMENTAL METAL

(71) Applicant: Novaled GmbH, Dresden (DE)

(72) Inventors: Bodo Wallikewitz, Dresden (DE); Carsten Rothe, Dresden (DE)

(73) Assignee: NOVALED GMBH, Dresden (DE)

(*) Notice: Subject to any disclaimer, the term of this patent is extended or adjusted under 35 U.S.C. 154(b) by 478 days.

(21) Appl. No.: 15/512,314

(22) PCT Filed: Sep. 17, 2015

(86) PCT No.: PCT/EP2015/071366
§ 371 (c)(1),
(2) Date: Mar. 17, 2017

(87) PCT Pub. No.: WO2016/042098
PCT Pub. Date: Mar. 24, 2016

(65) Prior Publication Data
US 2017/0279064 A1   Sep. 28, 2017

(30) Foreign Application Priority Data
Sep. 19, 2014 (EP) .................................. 14185560

(51) Int. Cl.
*H01L 51/50* (2006.01)
(52) U.S. Cl.
CPC ........ *H01L 51/5076* (2013.01); *H01L 51/508* (2013.01); *H01L 51/5088* (2013.01)
(58) Field of Classification Search
CPC ............. H01L 51/5052; H01L 51/5064; H01L 51/5076; H01L 51/508; H01L 51/5088
See application file for complete search history.

(56) References Cited

U.S. PATENT DOCUMENTS 7,972,541 B2 * 7/2011 Werner ................. H01L 51/002
 252/519.2
2003/0124764 A1 * 7/2003 Yamazaki ............... B05D 1/60
 438/99
(Continued)

FOREIGN PATENT DOCUMENTS

DE  102014117011 A1 *  2/2016
EP  2 752 907 A1       7/2014
(Continued)

OTHER PUBLICATIONS

Schmitz et al., Chem. Mater. (2000), 12, pp. 3012-3019. (Year: 2000).*
(Continued)

*Primary Examiner* — Dawn L Garret
(74) *Attorney, Agent, or Firm* — Eversheds Sutherland (US) LLP

(57) ABSTRACT

The present invention relates to a an organic light-emitting diode (OLED, 100) comprising at least one emission layer (150), and an electron transport layer stack (160) of at least two electron transport layers, wherein a first electron transport layer (161, 162) and a second electron transport layer (162, 161) comprises at least one matrix compound and in addition, —the at least first electron transport layer comprises a lithium halide or a lithium organic complex; and the at least second electron transport layer comprises an elemental metal selected from the group of lithium, magnesium and/or ytterbium; or—the at least first electron transport layer comprises an elemental metal selected from the group of lithium, magnesium and/or ytterbium; and the at least second electron transport layer comprises a lithium halide or a lithium organic complex; wherein the electron transport layer or layers comprising a lithium halide or a lithium organic complex is free of an elemental metal, and the (Continued)

electron transport layer or layers that comprises an elemental metal is free of a metal salt and/or a metal organic complex.

30 Claims, 3 Drawing Sheets

(56) References Cited

U.S. PATENT DOCUMENTS

2014/0048792 A1    2/2014  Chun et al.
2015/0144897 A1*  5/2015  Kang .................. H01L 51/5076
                                                     257/40

FOREIGN PATENT DOCUMENTS

| JP | 2008-195623 A | * | 8/2008 |
| WO | WO 2009/149860 A2 | * | 12/2009 |
| WO | WO 2012/175219 A1 | * | 12/2012 |
| WO | WO 2013/079217 A1 | * | 6/2013 |
| WO | WO 2013/079676 A1 | * | 6/2013 |
| WO | WO 2013/079678 A1 | * | 6/2013 |
| WO | WO 2016/030330 A1 | * | 3/2016 |

OTHER PUBLICATIONS

Machine translation for DE 102014117011 A1 (publication date Feb. 2016). (Year: 2016).*
PCT International Search Report and Written Opinion for PCT Application No. PCT/EP2015/071366 dated Dec. 7, 2015 (10 pages).

* cited by examiner

ORGANIC LIGHT-EMITTING DIODE INCLUDING AN ELECTRON TRANSPORT LAYER STACK COMPRISING DIFFERENT LITHIUM COMPOUNDS AND ELEMENTAL METAL

CROSS REFERENCE TO RELATED APPLICATIONS

This application is a U.S. national stage application of PCT/EP2015/071366, filed Sep. 17, 2015, which claims priority to European Application No. 14185560.1, filed Sep. 19, 2014. The contents of these applications are hereby incorporated by reference.

DESCRIPTION

The present invention relates to an organic light-emitting diode including an electron transport layer stack, and a method of manufacturing the same.

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

SUMMARY

It is one object to provide organic light-emitting diode having an increased external quantum efficiency (EQE) of OLEDs, especially for blue emitting OLEDs but also, for example for red, green or white, and/or an increased lifetime, in particular for top and/or bottom emission organic light-emitting diodes (OLED).

According to one aspect, there is provided an organic light-emitting diode (OLED) comprising an emission layer, and an electron transport layer stack of at least two electron transport layers, wherein a first electron transport layer and a second electron transport layer comprises at least one matrix compound and in addition,
the at least first electron transport layer comprises a lithium halide or a lithium organic complex; and the at least second electron transport layer comprises an elemental metal selected from the group of lithium, magnesium and/or ytterbium; or
the at least first electron transport layer comprises an elemental metal selected from the group of lithium, magnesium and/or ytterbium; and the at least second electron transport layer comprises a lithium halide or a lithium organic complex;
wherein the electron transport layer or layers comprising a lithium halide or a lithium organic complex is free of an elemental metal, and the electron transport layer or layers that comprises an elemental metal is free of a metal salt and/or a metal organic complex.

According to one aspect, there is provided an organic light-emitting diode (OLED) comprising an emission layer, and an electron transport layer stack of at least two electron transport layers, wherein a first electron transport layer and a second electron transport layer comprises at least one matrix compound and in addition,
the at least first electron transport layer comprises a lithium halide or a lithium organic complex; and the at least second electron transport layer comprises an elemental metal selected from the group of lithium, magnesium and/or ytterbium; or
the at least first electron transport layer comprises an elemental metal selected from the group of lithium, magnesium and/or ytterbium; and the at least second electron transport layer comprises a lithium halide or a lithium organic complex;
wherein the electron transport layer or layers comprising a lithium halide or a lithium organic complex is free of an elemental metal, and the electron transport layer or layers that comprises an elemental metal is free of a metal salt and/or a metal organic complex;
wherein the matrix compound of the electron transport layer stack are different for each electron transport layer, except for a phosphine oxide matrix compound. That means the phosphine oxide matrix compound may be same or different selected for each electron transport layer.

In the context that the electron transport layer or layers comprising a lithium halide or a lithium organic complex is free of an elemental metal, the term "free of" means that the electron transport layer or layers containing lithium halide/organic complex may comprise impurities of about 0.1 wt.-% or less, preferably about 0.01 wt.-% or less, and more preferably about 0.001 wt.-% or less of a metal dopant and most preferred no metal dopant.

In the context that the electron transport layer or layers that comprises an elemental metal is free of a metal salt and/or a metal organic complex, the term "free of" means that the electron transport layer or layers containing an elemental metal may comprise of about 5 wt.-% or less of a lithium halide and/or a lithium organic complex, preferably about 0.5 wt.-% or less, and more preferably about 0.05 wt.-% or less, and even more preferably about 0.005 wt.-% or less of a lithium halide and/or a lithium organic complex and most preferred no lithium halide and/or a lithium organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the matrix compound is a phosphine oxide based compound, preferably selected from the group comprising (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)-(phenyl)phosphine oxide, phenyldi(pyren-1-yl) phosphine oxide, (3-(9,10-di(naphthalen-2-yl)anthracen-2-yl)phenyl)diphenylphosphine oxide, phenyldi(pyren-1-yl) phosphine oxide, diphenyl(5-(pyren-1-yl)pyridin-2-yl) phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7- yl)-[1,1'-biphenyl]-4-yl)diphenylphosphine oxide and/or phenyl bis(3-(pyren-1-yl)phenyl)phosphine oxide; and in addition, the at least first electron transport layer comprises a lithium halide or a lithium organic complex; and the at least second electron transport layer comprises an elemental metal selected from the group of lithium, magnesium and/or ytterbium; or the at least first electron transport layer comprises an elemental metal selected from the group of lithium, magnesium and/or ytterbium; and the at least second electron transport layer comprises a lithium halide or a lithium organic complex;

wherein the electron transport layer or layers comprising a lithium halide or a lithium organic complex is free of an elemental metal, and the electron transport layer or layers that comprises an elemental metal is free of a metal salt and/or a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the first matrix compound is a phosphine oxide based compound, preferably selected from the group comprising (3-(dibenzo[c,h]acridin-7-yl)phenyl) diphenylphosphine oxide, 3-phenyl-3H-benzo[b]dinaphtho [2,1-d:1',2'-f]phosphepine-3-oxide, bis(4-(anthracen-9-yl) phenyl)(phenyl)phosphine oxide, phenyldi(pyren-1-yl) phosphine oxide, (3-(9,10-di(naphthalen-2-yl)anthracen-2-yl)phenyl)diphenylphosphine oxide, phenyldi(pyren-1-yl) phosphine oxide, diphenyl(5-(pyren-1-yl)pyridin-2-yl) phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; and in addition, the at least first electron transport layer comprises a lithium halide or a lithium organic complex; and the at least second electron transport layer comprises an elemental metal selected from the group of lithium, magnesium and/or ytterbium; or the at least first electron transport layer comprises an elemental metal selected from the group of lithium, magnesium and/or ytterbium; and the at least second electron transport layer comprises a lithium halide or a lithium organic complex;

wherein the electron transport layer or layers comprising a lithium halide or a lithium organic complex is free of an elemental metal, and the electron transport layer or layers that comprises an elemental metal is free of a metal salt and/or a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the first matrix compound is a phosphine oxide based compound, preferably selected from the group comprising (3-(dibenzo[c,h]acridin-7-yl)phenyl) diphenylphosphine oxide, 3-phenyl-3H-benzo[b]dinaphtho [2,1-d:1',2'-f]phosphepine-3-oxide, bis(4-(anthracen-9-yl) phenyl) (phenyl) phosphine oxide, phenyldi(pyren-1-yl) phosphine oxide, (3-(9,10-di(naphthalen-2-yl)anthracen-2-yl)phenyl)diphenylphosphine oxide, phenyldi(pyren-1-yl) phosphine oxide, diphenyl(5-(pyren-1-yl)pyridin-2-yl) phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; and in addition, the at least first electron transport layer comprises a lithium organic complex; and the at least second electron transport layer comprises an elemental metal selected from the group of lithium, magnesium and/or ytterbium;

wherein the electron transport layer or layers comprising a lithium halide or a lithium organic complex is free of an elemental metal, and the electron transport layer or layers that comprises an elemental metal is free of a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the first and second matrix compound are independently selected from a phosphine oxide based compound, preferably selected from the group comprising (3-(dibenzo[c,h]acridin-7-yl)phenyl)diphenylphosphine oxide, 3-phenyl-3H-benzo[b]dinaphtho[2,1-d:1', 2'-f]phosphepine-3-oxide, bis(4-(anthracen-9-yl)phenyl) (phenyl)phosphine oxide, phenyldi(pyren-1-yl)phosphine oxide, (3-(9,10-di(naphthalen-2-yl)anthracen-2-yl)phenyl) diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl) phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; and in addition, the at least first electron transport layer comprises a lithium organic complex; and the at least second electron transport layer comprises an elemental metal selected from the group of lithium, magnesium and/or ytterbium;

wherein the electron transport layer or layers comprising a lithium halide or a lithium organic complex is free of an elemental metal, and the electron transport layer or layers that comprises an elemental metal is free of a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the first and second matrix compound is a phosphine oxide based compound, preferably selected from the group comprising (3-(dibenzo[c,h]acridin-7-yl)phenyl)diphenylphosphine oxide, 3-phenyl-3H-benzo [b]dinaphtho[2,1-d:1',2'-f]phosphepine-3-oxide, bis(4-(anthracen-9-yl)phenyl)(phenyl) phosphine oxide, phenyldi (pyren-1-yl)phosphine oxide, (3-(9,10-di(naphthalen-2-yl) anthracen-2-yl)phenyl)diphenylphosphine oxide, phenyldi (pyren-1-yl)phosphine oxide, diphenyl(5-(pyren-1-yl) pyridin-2-yl)phosphine oxide, diphenyl(4'-(pyren-1-yl)-[1, 1'-biphenyl]-3-yl)phosphine oxide, diphenyl(4'-(pyren-1-yl)-[1,1'-biphenyl]-3-yl)phosphine oxide, (3'-(dibenzo[c,h] acridin-7-yl)-[1,1'-biphenyl]-4-yl)diphenylphosphine oxide and/or phenyl bis(3-(pyren-1-yl)phenyl)phosphine oxide; and in addition, the at least first electron transport layer comprises a lithium organic complex; and the at least second electron transport layer comprises an elemental metal selected from the group of lithium, magnesium and/or ytterbium;

wherein the electron transport layer or layers comprising a lithium halide or a lithium organic complex is free of an elemental metal, and the electron transport layer or layers that comprises an elemental metal is free of a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the second matrix compound is a phosphine oxide based compound, preferably selected from the group comprising (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; and in addition,
 the at least first electron transport layer comprises a lithium halide or a lithium organic complex; and the at least second electron transport layer comprises an elemental metal selected from the group of lithium, magnesium and/or ytterbium; or
 the at least first electron transport layer comprises an elemental metal selected from the group of lithium, magnesium and/or ytterbium; and the at least second electron transport layer comprises a lithium halide or a lithium organic complex;
wherein the electron transport layer or layers comprising a lithium halide or a lithium organic complex is free of an elemental metal, and the electron transport layer or layers that comprises an elemental metal is free of a metal salt and/or a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound, wherein the second matrix compound is a phosphine oxide based compound, preferably selected from the group comprising (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl) (phenyl) phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide; and in addition, the at least first electron transport layer comprises a lithium organic complex; and the at least second electron transport layer comprises an elemental metal selected from the group of lithium, magnesium and/or ytterbium;
wherein the electron transport layer or layers comprising a lithium halide or a lithium organic complex is free of an elemental metal, and the electron transport layer or layers that comprises an elemental metal is free of a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound and in addition,
 the at least first electron transport layer comprises a lithium halide or a lithium organic complex, preferably a lithium organic complex; and the at least second electron transport layer comprises an elemental metal selected from the group of ytterbium and/or magnesium, preferably ytterbium, in view of the stronger doping effect magnesium can be more preferred; or
 the at least first electron transport layer comprises an elemental metal selected from the group of ytterbium and/or magnesium, preferably ytterbium; and the at least second electron transport layer comprises a lithium halide or a lithium organic complex, preferably a lithium organic complex;
wherein the electron transport layer or layers comprising a lithium halide or a lithium organic complex is free of an elemental metal, and the electron transport layer or layers that comprises an elemental metal is free of a metal salt and/or a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound and in addition,
 the at least first electron transport layer comprises a lithium organic complex; and the at least second electron transport layer comprises an elemental metal selected from the group of ytterbium and/or magnesium, preferably ytterbium; or
 the at least first electron transport layer comprises an elemental metal selected from the group of ytterbium and/or magnesium, preferably ytterbium; and the at least second electron transport layer comprises a lithium organic complex;
wherein the electron transport layer or layers comprising a lithium organic complex is free of an elemental metal, and the electron transport layer or layers that comprises an elemental metal is free of a metal salt and/or a metal organic complex.

According to various aspects, there is provided an organic light-emitting diode comprising at least one emission layer, and an electron transport layer stack of at least two electron transport layers, wherein a first electron transport layer and a second electron transport layer comprises at least one matrix compound and in addition,
 the at least first electron transport layer comprises a lithium organic complex; and the at least second electron transport layer comprises an elemental metal selected from the group of lithium, ytterbium and/or magnesium, preferably magnesium; or
 the at least first electron transport layer comprises an elemental metal selected from the group of lithium, ytterbium and/or magnesium, preferably magnesium; and the at least second electron transport layer comprises a lithium organic complex;
wherein the electron transport layer or layers comprising a lithium organic complex is free of an elemental metal, and the electron transport layer or layers that comprises an elemental metal is free of a metal salt and/or a metal organic complex.

According to various aspects, there is provided an organic light-emitting diode comprising at least one emission layer, and an electron transport layer stack of at least three electron transport layers, wherein
- at least two electron transport layers comprising a lithium halide or a lithium organic complex; and at least one electron transport layer comprises an elemental metal selected from the group of lithium, magnesium and/or ytterbium; or
- at least two electron transport layers comprising an elemental metal selected from the group of lithium, magnesium and/or ytterbium; and at least one electron transport layer comprises a lithium halide or a lithium organic complex;

wherein for an electron transport layer stack comprising at least two electron transport layers comprising a lithium halide or a lithium organic complex the lithium halide or lithium organic complex of each electron transport layer are selected same or different, and preferably different and more preferred selected the same; and/or wherein for an electron transport layer stack comprising at least two electron transport layers comprising an elemental metal selected from the group of lithium, magnesium and/or ytterbium; the elemental metal selected from the group of lithium, magnesium and/or ytterbium of each electron transport layer are selected same or different, and preferably selected the same.

According to various aspects, wherein for an electron transport layer stack comprising at least three electron transport layers, at least one or two electron transport layers comprising a lithium organic complex, the lithium organic complex of each electron transport layer are selected same or different, and preferably the same; and the remaining electron transport layers, comprising an elemental metal selected from the group of lithium, magnesium and/or ytterbium, preferably magnesium and/or ytterbium, wherein each electron transport layer comprising an elemental metal, the elemental metal are selected same or different, and preferably the same.

According to various aspects, wherein for an electron transport layer stack of two electron transport layers the first electron transport layer is arranged closest to at least one emission layer, and the second electron transport layer is arranged closest to a cathode.

According to various aspects, wherein for an electron transport layer stack of three electron transport layers the first electron transport layer is arranged closest to an emission layer, the second electron layer is sandwiched between the first and the third electron transport layer and the third electron transport layer is arranged closest to a cathode.

The organic light-emitting diode can be a bottom emission OLED or a top emission OLED.

For the following defined terms, these definitions shall be applied, unless a different definition is given in the claims or elsewhere in this specification.

The external quantum efficiency, also named EQE, is measured in percent (%).

The lifetime, also named LT, between starting brightness and 97% of the original brightness is measured in hours (h).

The voltage, also named V, is measured in Volt (V) at 10 milliAmpere per square centimeter ($mA/cm^2$) in bottom emission devices and at 15 $mA/cm^2$ for top emission devices.

The colour space is described by coordinates CIE-x and CIE-y (International Commission on Illumination 1931). For blue emission the CIE-y is of particular importance. A smaller CIE-y denotes a deeper blue color.

The efficiency of top emission OLEDs is recorded in candela per Ampere, also named cd/A. Candela is a SI base unit of luminous intensity and describes the power emitted by a light source in a particular direction, weighted by the luminosity function (a standardized model of the sensitivity of the human eye to different wavelengths). The human eye is particularly insensitive to deep blue and deep red colors. Therefore, the efficiency measured in cd/A is corrected for the emission color, in the case of blue emission, the CIE-y. For example, a deeper blue OLED would have a lower cd/A efficiency even if the quantum efficiency (photons in compared to photons out) is the same. By dividing the efficiency measured in cd/A by the CIE-y, the efficiency of OLEDs with slightly different shades of blue can be compared. The efficiency, also named Eff., is measured in Candela per Ampere (cd/A) and divided by the CIE-y.

The highest occupied molecular orbital, also named HOMO, and lowest unoccupied molecular orbital, also named LUMO, are measured in electron volt (eV).

The term "not the same as" with respect to a lithium halide or a lithium organic complex means that the electron transport layers comprising lithium halide or a lithium organic complex, differs in its containing lithium halide or lithium organic complex.

The term "not the same as" with respect to elemental metal selected from the group of lithium, magnesium and/or ytterbium means that the electron transport layers containing elemental lithium, magnesium and/or ytterbium, differs in its containing elemental metal.

The term "OLED" and "organic light-emitting diode" is simultaneously used and having the same meaning.

As used herein, weight percent", wt.-%", percent by weight", % by weight", and variations thereof refer to an elemental metal, a composition, component, substance or agent as the weight of that elemental metal, component, substance or agent of the respective electron transport layer divided by the total weight of the respective electron transport layer thereof and multiplied by 100. It is understood that the total weight percent amount of all elemental metal, components, substances or agents of the respective electron transport layer are selected such that it does not exceed 100 wt.-%.

As used herein, volume percent", vol.-%", percent by volume", % by volume", and variations thereof refer to an elemental metal, a composition, component, substance or agent as the volume of that elemental metal, component, substance or agent of the respective electron transport layer divided by the total volume of the respective electron transport layer thereof and multiplied by 100. It is understood that the total volume percent amount of all elemental metal, components, substances or agents of the respective electron transport layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about", the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

The cathode is not an electron transport layer or electron layer stack. In particular the second electron transport layer is not a cathode. According to the present invention the cathode and the electron transport layer differs in their chemical composition.

Further, the electron layer stack is arranged between the anode and cathode layer.

Further, for reasons of clarification, the electron transport layer differs in their chemical composition from the cathode described in EP 2 075 858 A1.

The term "alkyl" refers to straight-chain or branched alkyl groups. The term "1 to 20 carbon atoms" as used herein refers to straight-chain or branched alkyl groups having 1 to 20 carbon atoms. The alkyl groups can be selected from the group comprising methyl, ethyl and the isomers of propyl, butyl or pentyl, such as isopropyl, isobutyl, tert.-butyl, sec.-butyl and/or isopentyl. The term "aryl" refers to aromatic groups for example phenyl or naphthyl.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

According to various embodiments of the OLED, the electron transport layer stack wherein at least one electron transport layer may be free of a lithium halide or all electron transport layers may be free of a lithium halide.

According to various embodiments of the OLED the electron transport layer stack may comprise as a lithium compound a lithium organic complex only.

According to various embodiments of the organic light-emitting diode the amount of the lithium halide or lithium organic complex in an electron transport layer stack, preferably the at least first electron transport layer, is in the range of about ≥10 mol-% to about ≤95 mol-%, preferably about ≥15 mol-% to about ≤90 mol-% and also preferred about ≥20 mol-% to about ≤80 mol-%, of the corresponding electron transport layer; and/or the amount of the lithium halide or lithium organic complex in an electron transport layer stack of at least three electron transport layers, at least two of the electron transport layers, preferably the at least first electron transport layer and/or the at least third electron transport layer, is in the range of about ≥10 mol-% to about ≤95 mol-%, preferably about ≥15 mol-% to about ≤90 mol-% and also preferred about ≥20 mol-% to about ≤80 mol-%, of the corresponding electron transport layer.

According to various embodiments of the OLED of the present invention the lithium halide or lithium halide can be selected from the group comprising LiF, LiCl, LiBr and LiJ. However, most preferred is LiF.

According to various embodiments of the organic light-emitting diode comprising an electron transport layer stack, preferably of at least two electron transport layer or three electron transport layer, wherein
at least one electron transport layer, comprises about ≥1 wt.-% to about ≤60 wt.-%, preferably about ≥2 wt.-% to about ≤55 wt.-% and also preferred about ≥5 wt.-% to about ≤45 wt.-% of an elemental metal selected from the group of lithium, magnesium and/or ytterbium; or
at least two electron transport layer (161/163) of at least three electron transport layers (161/162/163) comprises about ≥1 wt.-% to about ≤60 wt.-%, preferably about ≥2 wt.-% to about ≤55 wt.-% and also preferred about ≥5 wt.-% to about ≤45 wt.-% of an elemental metal selected from the group of lithium, magnesium and/or ytterbium;

wherein the weight percent of the elemental metal selected from the group of lithium, magnesium and/or ytterbium is based on the total weight of the corresponding electron transport layer.

According to various embodiments of the organic light-emitting diode (OLED) of the present invention the organic ligand of the lithium organic complex can be a quinolate. Preferably the lithium organic complex is a lithium organic complex of formula I, II or III:

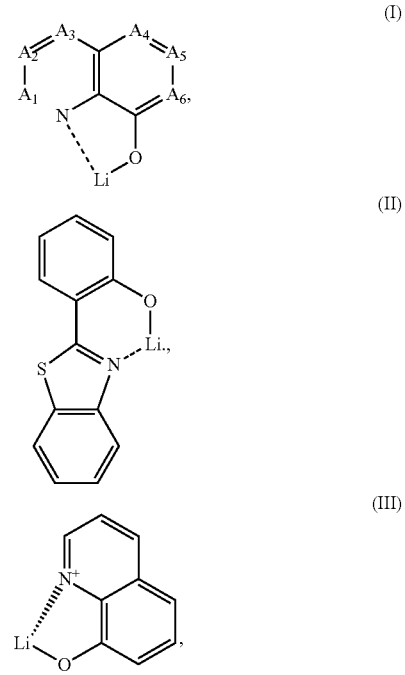

wherein
A1 to A6 are same or independently selected from CH, CR, N, O;
R is same or independently selected from hydrogen, halogen, alkyl or aryl or heteroaryl with 1 to 20 carbon atoms; and more preferred A1 to A6 are CH.

Quinolates that can be suitable used are disclosed in WO 2013079217 A1 and incorporated by reference.

According to various embodiments of the organic light-emitting diode (OLED) of the present invention the organic ligand of the lithium organic complex can be a borate based organic ligand, Preferably the lithium organic complex is a lithium tetra(1H-pyrazol-1-yl)borate. Borate based organic ligands that can be suitable used are disclosed in WO 2013079676 A1 and incorporated by reference.

According to various embodiments of the organic light-emitting diode (OLED) of the present invention the organic ligand of the lithium organic complex can be a phenolate ligand, Preferably the lithium organic complex is a lithium 2-(diphenylphosphoryl)phenolate. Phenolate ligands that can be suitable used are disclosed in WO 2013079678 A1 and incorporated by reference.

Further, phenolate ligands can be selected from the group of pyridinolate, preferably 2-(diphenylphosphoryl)pyridin- 3-olate. Pyridine phenolate ligands that can be suitable used are disclosed in JP 2008195623 and incorporated by reference.

In addition, phenolate ligands can be selected from the group of imidazol phenolates, preferably 2-(1-phenyl-1H-benzo[d]imidazol-2-yl)phenolate. Imidazol phenolate ligands that can be suitable used are disclosed in JP 2001291593 and incorporated by reference.

Also, phenolate ligands can be selected from the group of oxazol phenolates, preferably 2-(benzo[d]oxazol-2-yl)phenolate. Oxazol phenolate ligands that can be suitable used are disclosed in US 20030165711 and incorporated by reference.

Lithium Schiff base organic complexes can be use. Lithium Schiff base organic complexes that can be suitable used having the structure 100, 101, 102 or 103:

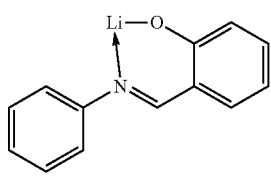
100

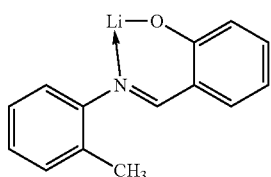
101

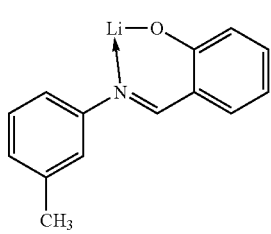
102

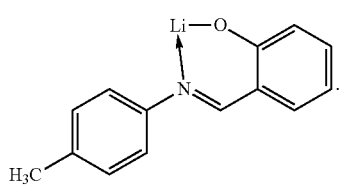
103

According to various embodiments of the organic light-emitting diode (OLED) of the present invention the organic ligand of the lithium organic complex is a quinolate, a borate, a phenolate, a pyridinolate or a Schiff base ligand; preferably the lithium quinolate complex has the formula I, II or III:

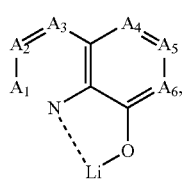
(I)

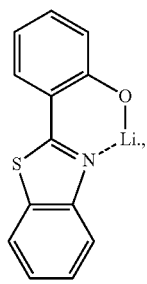
(II)

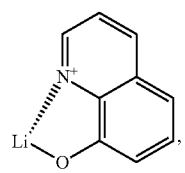
(III)

wherein

A1 to A6 are same or independently selected from CH, CR, N, O;

R is same or independently selected from hydrogen, halogen, alkyl or aryl or heteroaryl with 1 to 20 carbon atoms; and more preferred A1 to A6 are CH;

preferably the borate based organic ligand is a tetra(1H-pyrazol-1-yl)borate;

preferably the phenolate is a 2-(pyridin-2-yl)phenolate, a 2-(diphenylphosphoryl)-phenolate, an imidazol phenolates, or 2-(pyridin-2-yl)phenolate and more preferred 2-(1-phenyl-1H-benzo[d]imidazol-2-yl)phenolate;

preferably the pyridinolate is a 2-(diphenylphosphoryl) pyridin-3-olate, preferably the lithium Schiff base has the structure 100, 101, 102 or 103:

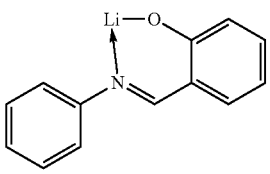
100

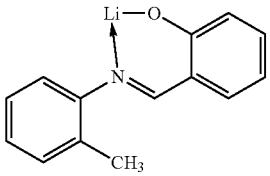
101

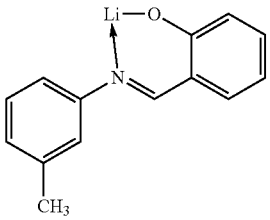
102

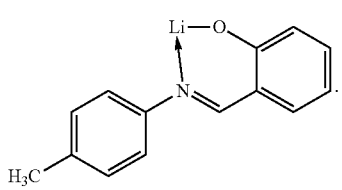

According to various embodiments of the organic light-emitting diode (OLED) of the present invention the first electron transport layer, the second electron transport layer and/or in case of three electron transport layers the third electron transport layer as well, may comprises at least one matrix compound each.

According to various embodiments of the organic light-emitting diode (OLED) of the present invention comprising an electron transport layer stack of at least two electron transport layers or at least three electron transport layers, wherein each electron transport layer comprises at least one matrix compound, whereby the matrix compound of the electron transport layers are selected same or different.

According to various embodiments of the organic light-emitting diode (OLED) the at least two electron transport layers (161/162) or the at least three electron transport layers (161/162/163) comprise at least one matrix compound, whereby the matrix compound of the electron transport layers are selected same or different, and wherein the electron matrix compound is selected from:

an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4''-di(naphthalen-1-yl)-N4,N4''-diphenyl-[1,1':4',1''-terphenyl]-4,4''-diamine;

a phosphine oxide based compound, preferably (3-(dibenzo[c,h]acridin-7-yl)phenyl)diphenylphosphine oxide, phenyl bis (3-(pyren-1-yl)phenyl)phosphine oxide, 3-Phenyl-3H-benzo[b]dinaphtho[2,1-d:1',2'-f]phosphepine-3-oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or bis(4-(anthracen-9-yl)phenyl)(phenyl)phosphine oxide;

a substituted phenanthroline compound, preferably 2,4,7,9-tetraphenyl-1,10-phenanthroline, 4,7-diphenyl-2,9-di-p-tolyl-1,10-phenanthroline and/or 2,9-di(biphenyl-4-yl)-4,7-diphenyl-1,10-phenanthroline.

According to various embodiments of the organic light-emitting diode (OLED) of the present invention the thicknesses of each electron transport layer, preferably the at least first electron transport layer (161) and the at least second electron transport layer (162) and/or the at least third electron transport layer (163), are same or each independently, in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

According to various embodiments of the organic light-emitting diode (OLED) the thicknesses of the electron transport layer stack can be in the range of about ≥25 nm to about ≤100 nm, preferably of about ≥30 nm to about ≤80 nm, further preferred of about ≥35 nm to about ≤60 nm, and more preferred of about ≥36 nm to about ≤40 nm.

According to various embodiments of the organic light-emitting diode (OLED) of the present invention the electron transport layer stack has 2 to 4 electron transport layers and more preferred 2 to 3 electron transport layers.

According to various embodiments of the organic light-emitting diode (OLED) of the present invention the second electron transport layer can be formed directly on the first electron transport layer and an optional third electron transport layer can be formed directly on the second electron transport layer, so that the second electron transport layer is sandwiched between the first and third electron transport layers.

According to various embodiments of the organic light-emitting diode (OLED) of the present invention:

at least one electron transport layer or in case of at least three electron transport layers at least two electron transport layer comprise:

a) about ≥10 wt.-% to about ≤70 wt.-%, preferably about ≥20 wt.-% to about ≤65 wt.-% and also preferred about ≥50 wt.-% to about ≤60 wt.-% of a lithium halide, selected from the group comprising a LiF, LiCl, LiBr or LiJ, preferably LiF, or of a lithium organic complex of a lithium quinolate, a borate, a phenolate, a pyridinolate or a Schiff base ligand; preferably of a lithium quinolate complex has the formula I, II or III:

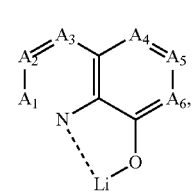

(I)

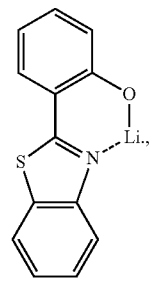

(II)

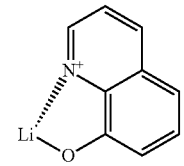

(III)

wherein
A1 to A6 are same or independently selected from CH, CR, N, O,
R is same or independently selected from hydrogen, halogen, alkyl or aryl or heteroaryl with 1 to 20 carbon atoms, and more preferred of a lithium 8-hydroxyquinolate;

b) about ≤90 wt.-% to about ≥30 wt.-%, preferably about ≤80 wt.-% to about ≥35 wt.-% and also preferred about ≤50 wt.-% to about ≥40 wt.-% and also preferred about ≤50 wt.-% to about ≥40 wt.-% of a matrix compound of:
an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole and/or N4,N4"-di(naphthalen-1-yl)-N4,N4"-diphenyl-[1,1':4',1"-terphenyl]-4,4"-diamine;
a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)
diphenylphosphine oxide and/or phenyl bis(3-(pyren-1-yl)phenyl)phosphine oxide;
a substituted phenanthroline compound, preferably 2,4,7,9-tetraphenyl-1,10-phenanthroline, 4,7-diphenyl-2,9-di-p-tolyl-1,10-phenanthroline and/or 2,9-di(biphenyl-4-yl)-4,7-diphenyl-1,10-phenanthroline;
whereby more preferred is a phosphine oxide based compound and most preferred is (3-(dibenzo[c,h]acridin-7-yl)phenyl)diphenylphosphine oxide;
and
at least one electron transport layer or in case of at least three electron transport layers at least two electron layers comprising:
c) about ≥1 wt.-% to about ≤60 wt.-%, preferably about ≥2 wt.-% to about ≤55 wt.-% and also preferred about ≥5 wt.-% to about ≤45 wt.-% of an elemental metal selected from the group of lithium, magnesium and/or ytterbium, more preferred of an elemental metal magnesium;
d) about ≤99 wt.-% to about ≥40 wt.-%, preferably about ≤98 wt.-% to about ≥45 wt.-% and also preferred about ≤95 wt.-% to about ≥55 wt.-% of a matrix compound of:
an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]-imidazole and/or N4,N4"-di(naphthalen-1-yl)-N4,N4"-diphenyl-[1,1':4',1"-terphenyl]-4,4"-diamine;
a phosphine oxide based compound, preferably (3-(dibenzo[c,h]acridin-7-yl)phenyl)-diphenylphosphine oxide, 3-phenyl-3H-benzo[b]dinaphtho[2,1-d:1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)
diphenylphosphine oxide and/or phenyl bis(3-(pyren-1-yl)phenyl)phosphine oxide;
a substituted phenanthroline compound, preferably 2,4,7,9-tetraphenyl-1,10-phenanthroline, 4,7-diphenyl-2,9-di-p-tolyl-1,10-phenanthroline and/or 2,9-di(biphenyl-4-yl)-4,7-diphenyl-1,10-phenanthroline;
wherein more preferred is a phosphine oxide based compound and most preferred is (3-(dibenzo[c,h]acridin-7-yl)phenyl)diphenylphosphine oxide;
wherein the weight percent of each component is based on the total weight of the corresponding electron transport layer.

According to various embodiments of the OLED of the present invention:
the at least one, preferably two, lithium organic complex containing electron transport layer (161) comprises of about ≥50 wt.-% to about ≤60 wt.-% of a lithium 8-hydroxyquinolate and about ≤50 wt.-% to about ≥40 wt.-% of a (3-(dibenzo[c,h]acridin-7-yl)phenyl)diphenylphosphine oxide; and
the at least one, preferably two, elemental metal containing electron transport layer (162) comprises of about ≥2 wt.-% to about ≤45 wt.-% of an elemental metal selected from the group of lithium, magnesium and/or ytterbium, more preferred of an elemental metal magnesium and about ≤98 wt.-% to about ≥55 wt.-% of a (3-(dibenzo[c,h]acridin-7-yl)phenyl)diphenylphosphine oxide.

According to another aspect, there is provided an organic light-emitting diode comprising: a substrate; a first anode electrode formed on the substrate; a second cathode electrode formed on the first anode electrode; and an electron transport layer stack arranged between the first anode electrode and the second cathode electrode, comprising or consisting of at least two electron transport layers or at least three electron transport layers.

According to various embodiments, the organic light-emitting diode (OLED) may further include at least one layer selected from the group consisting of a hole injection layer, a hole transport layer, an emission layer, and a hole blocking layer, arranged between the first anode electrode and the electron transport layer.

According to another aspect, there is provided an organic light-emitting diode comprising in addition: at least one layer selected from the group consisting of a hole injection layer, a hole transport layer, an emission layer, and a hole blocking layer, arranged between the first anode electrode and the electron transport layer stack.

According to various aspects, there is provided an organic light-emitting diode further comprising an electron injection layer arranged between the electron transport layer and the second cathode electrode.

According to various embodiments of the OLED of the present invention, the OLED may not comprise an electron injection layer.

According to another aspect, there is provided a method of manufacturing an organic light-emitting diode (OLED), the method using:
deposition via at least three deposition sources; or
deposition via vacuum thermal evaporation; or
deposition via solution processing, preferably the processing is selected from spin-coating, printing, casting and/or slot-die coating.

According to various aspects, there is provided a method using:
at least one or two deposition sources to release the matrix compound, and
at least one or two deposition sources to release lithium halide or lithium organic complex, and at least at least one or two deposition sources to release the elemental metal; the method comprising the steps of forming the electron transport layer stack; whereby a first electron transport layer is formed by releasing the matrix compound from at least one deposition source and a lithium halide or a lithium organic complex or an elemental metal is released from at different deposition source;

onto the first electron transport layer a second electron transport layer is formed by releasing the matrix compound from at least one deposition source and a lithium halide or a lithium organic complex or an elemental metal is released from at different deposition source;

onto the second electron transport layer a third electron transport layer is formed by releasing the matrix compound from at least one deposition source and a lithium halide or a lithium organic complex or an elemental metal is released from at different deposition source; whereby at least one electron transport layer comprises a lithium halide or a lithium organic complex and is free of an elemental metal; and at least one electron transport layer comprises an elemental metal and is free of a lithium halide or a lithium organic complex.

According to various aspects, the method may further include forming on the first anode electrode at least one emission layer, and at least one layer selected from the group consisting of forming a hole injection layer, forming a hole transport layer, or forming a hole blocking layer, between the first anode electrode and the electron transport layer stack.

According to various aspects, the method may further include the steps for forming an organic light-emitting diode (OLED), wherein
- on a substrate a first anode electrode is formed,
- on the first anode electrode an emission layer is formed,
- on the emission layer an electron transport layer stack is formed, comprising at least two, or at least three electron transport layers, preferably the first electron transport layer is formed on the emission layer and the second electron transport layer or, in case of a third electron transport layer, the third electron transport layer is formed directly on the first electron transport layer,
- on the electron transport layer stack a second cathode electrode is formed,
- optional a hole injection layer, a hole transport layer, and a hole blocking layer, formed in that order between the first anode electrode and the emission layer,
- optional an electron injection layer is arranged between the electron transport layer and the second cathode electrode.

According to various aspects, the method may further include forming an electron injection layer on the electron transport layer stack.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
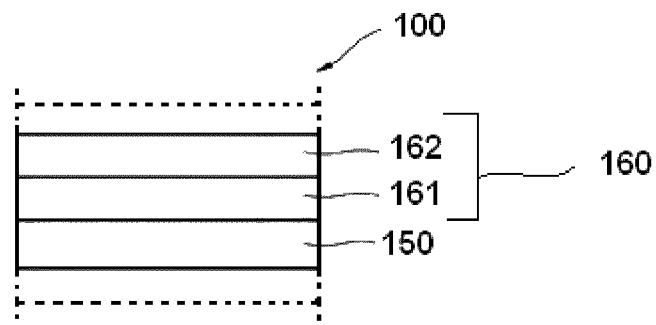
FIG. 1 is a schematic sectional view of an organic light-emitting diode (OLED), according to an exemplary embodiment of the present invention with two electron transport layers.

Reference will now be made in detail to the exemplary aspects, examples of which are illustrated in the accompanying drawings, wherein like reference numerals refer to the like elements throughout. The exemplary embodiments are described below, in order to explain the aspects, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode 100, according to an exemplary embodiment of the present invention. The OLED 100 includes an emission layer 150 and an electron transport layer stack (ETL) 160 comprising a first electron transport layer 161 and a second electron transport layer 162, whereby the second electron transport layer 162 is disposed directly on the first electron transport layer 161.

Figure 2:
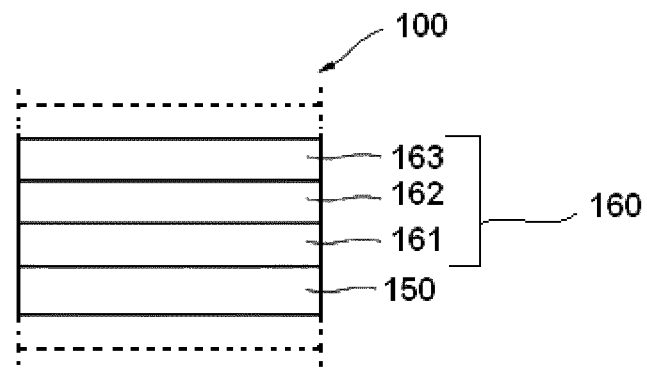
FIG. 2 is a schematic sectional view of an OLED, according to an exemplary embodiment of the present invention with three electron transport layers.

FIG. 2 is a schematic sectional view of an organic light-emitting diode 100, according to an exemplary embodiment of the present invention. The OLED 100 includes an emission layer 150 and an electron transport layer stack (ETL) 160 comprising a first electron transport layer 161, a second electron transport layer 162, and a third electron transport layer 163, whereby the second electron transport layer 162 is disposed directly on the first electron transport layer 161 and the third electron transport layer 163 is disposed directly on the first electron transport layer 162.

Figure 3:
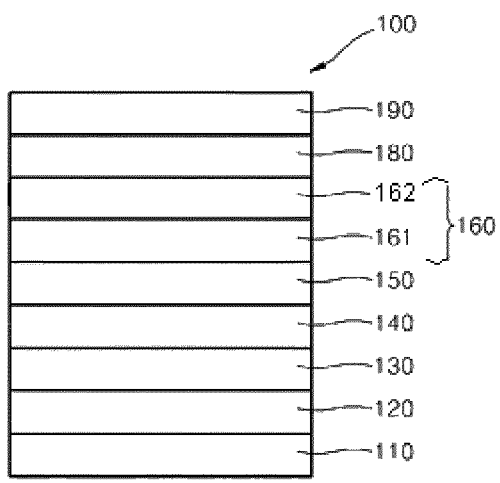
FIG. 3 is a schematic sectional view of an organic light-emitting diode (OLED), according to an exemplary embodiment of the present invention with two electron transport layers.

FIG. 3 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190. The electron transport layer (ETL) 160 includes a first electron transport layer 161 including a matrix material and a lithium halide or a lithium organic complex and a second electron transport layer 162 including an elemental metal selected from the group comprising of lithium, magnesium and/or ytterbium. The second electron transport layer 162 is directly formed on the first electron transport layer 161. The first layer 161 may be formed directly on the EML 150.

Figure 4:
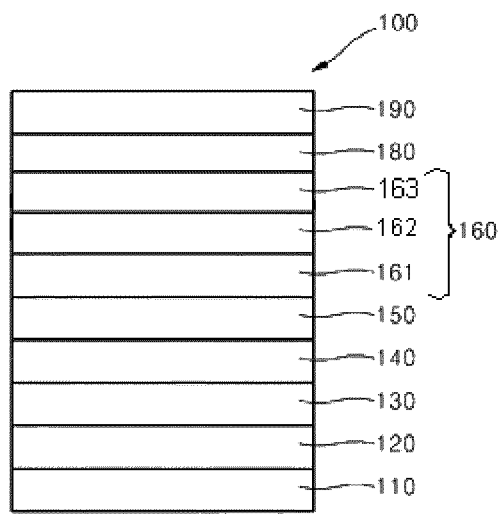
FIG. 4 is a schematic sectional view of an OLED, according to an exemplary embodiment of the present invention with three electron transport layers.

FIG. 4 is a schematic sectional view of an organic light-emitting diode 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190. The electron transport layer (ETL) 160 includes a first electron transport layer 161 and a third electron transport layer 163 including a matrix material and a lithium halide or a lithium organic complex, wherein the lithium halide or the lithium organic complex of the first electron transport layer 161 is not the same as the lithium halide or the lithium organic complex of the third electron transport layer 163; and the second electron transport layer 162 including an elemental metal of lithium, magnesium and/or ytterbium. The second electron transport layer 162 is directly formed on the first electron transport layer 161 and the third electron layer 163 is directly formed on the second electron layer 162. The first layer 161 may be formed directly on the emission layer (EML) 150.

The substrate 110 may be any substrate that is commonly used in manufacturing of organic light-emitting diodes. If light is emitted through the substrate, the substrate 110 may be a transparent material, for example a glass substrate or a transparent plastic substrate, having excellent mechanical strength, thermal stability, transparency, surface smoothness, ease of handling, and waterproofness. If light is emitted through the top surface, the substrate 110 may be a transparent or non-transparent material, for example a glass substrate, a plastic substrate, a metal substrate or a silicon substrate.

The first anode electrode 120 may be formed by depositing or sputtering a compound that is used to form the first anode electrode 120. The compound used to form the first anode electrode 120 may be a high work-function compound, so as to facilitate hole injection. If a p-doped HIL is used, the anode material may also be selected from a low work function material (i.e. Aluminum). The first anode electrode 120 may be a transparent or reflective electrode. Transparent conductive compounds, such as indium tin oxide (ITO), indium zinc oxide (IZO), tin-dioxide ($SnO_2$), and zinc oxide (ZnO), may be used to form the first anode electrode 120. The first anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The HIL 130 may be formed on the first anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris(3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N-Bis (naphthalen-1-yl)-N,N-bis(phenyl)-benzidine) doped with F4TCNQ. α-NPD doped with 2,2'-(perfluoronaphthalene-2, 6-diylidene)dimalononitrile (PD1). α-NPD doped with 2,2', 2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N-bis(3-methylphenyl)-N,N-diphenyl-[1,1-biphenyl]-4,4'-diamine (TPD), or N,N'-di(naphthalene-1-yl)-N,N'-diphenyl benzydine (alpha-NPD); and a triphenylamine-based compound, such as 4,4',4"-tris(N-carbazolyl)triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

The EML 150 may be formed on the HTL 140 by vacuum deposition, spin coating, slot-die coating, printing, casting, LB, or the like. When the EML 150 is formed using vacuum deposition or spin coating, the conditions for deposition and coating may be similar to those for the formation of the HIL 130. However, the conditions for deposition and coating may vary, according to the compound that is used to form the EML 150.

The emission layer (EML) 150 may be formed of a combination of a host and a dopant. Example of the host are Alq3, 4,4'-N,N'-dicarbazole-biphenyl (CBP), poly(n-vinyl-carbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ)2), E3 below, ADN and referred to as Formula 1, Compound 1 below, and Compound 2 below.

E3

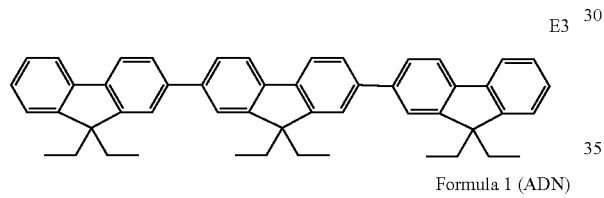

Formula 1 (ADN)

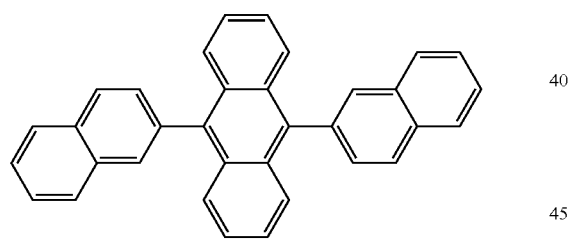

Compound 1

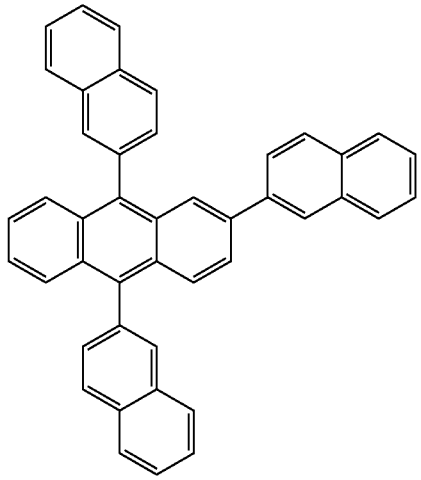

Compound 2

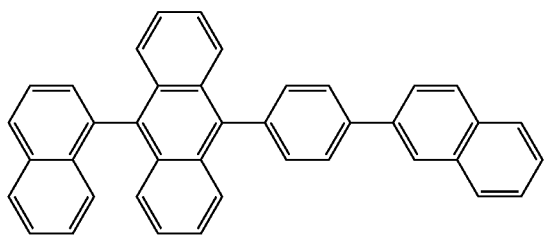

The dopant may be a phosphorescent or fluorescent emitter. Phosphorescent emitters are preferred due to their higher efficiency Examples of a red dopant are PtOEP, Ir(piq)3, and Btp 2Ir(acac), but are not limited thereto. These compounds are phosphorescent emitters, however, fluorescent red dopants could also be used.

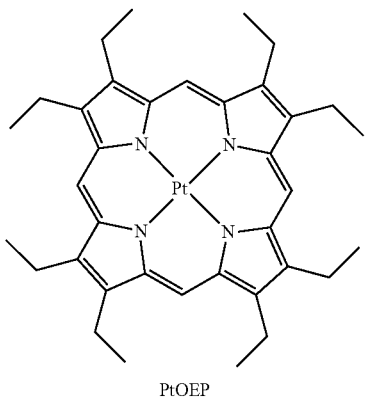

PtOEP

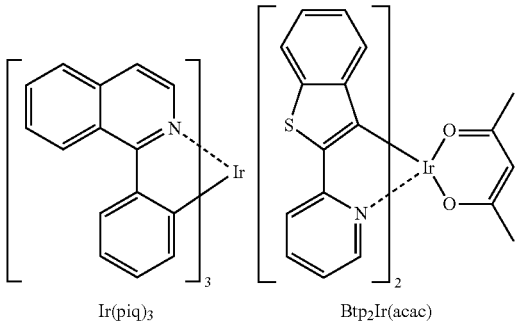

Ir(piq)₃  Btp₂Ir(acac)

Examples of a phosphorescent green dopant are Ir(ppy)3 (ppy=phenylpyridine), Ir(ppy)2(acac), Ir(mpyp)3 are shown below. Compound 3 is an example of a fluorescent green emitter and the structure is shown below.

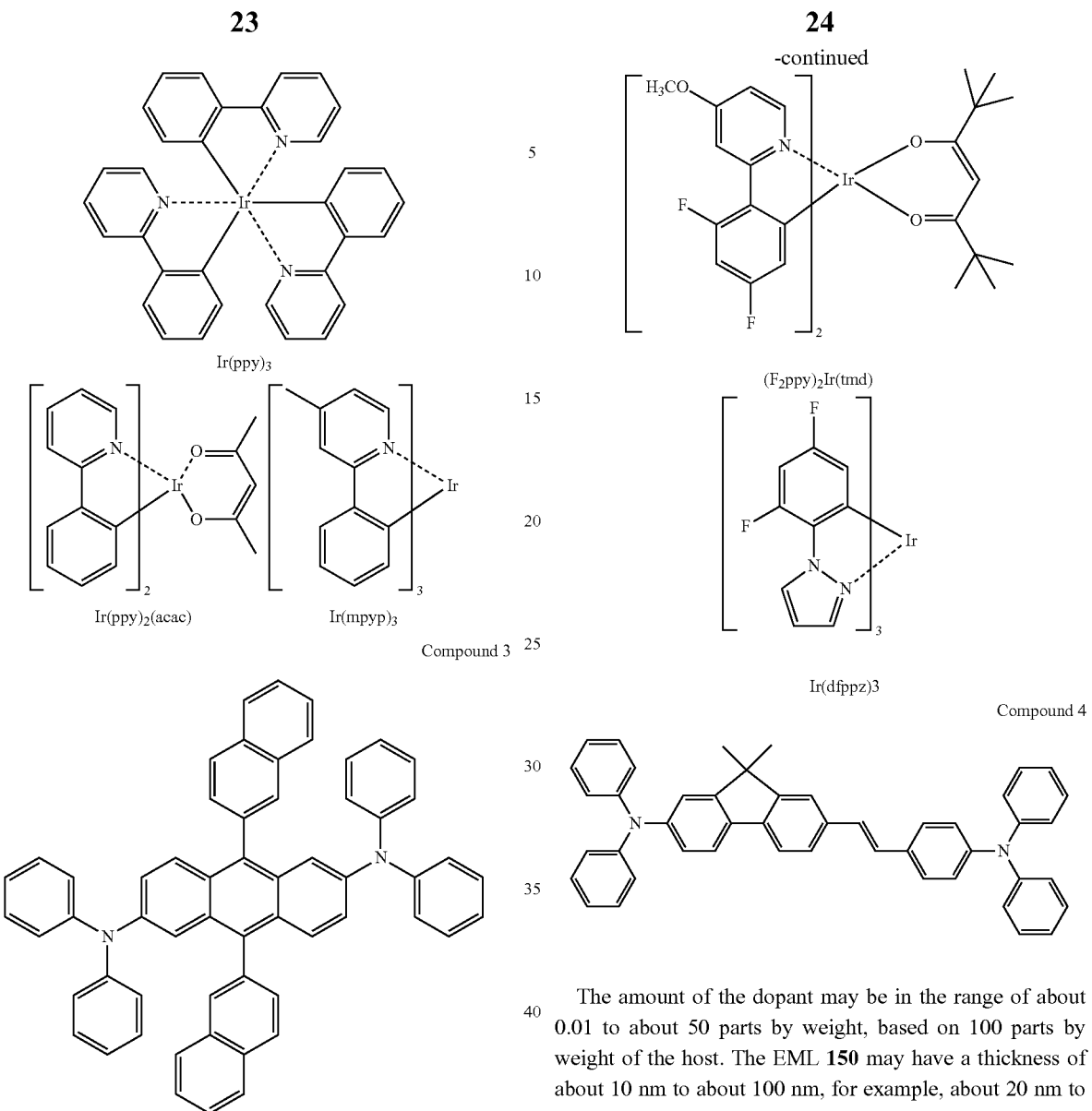

Examples of a phosphorescent blue dopant are F₂Irpic, (F₂ppy)₂Ir(tmd) and Ir(dfppz) 3, ter-fluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

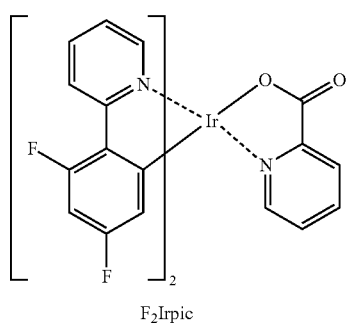

The amount of the dopant may be in the range of about 0.01 to about 50 parts by weight, based on 100 parts by weight of the host. The EML 150 may have a thickness of about 10 nm to about 100 nm, for example, about 20 nm to about 60 nm. When the thickness of the EML 150 is within this range, the EML 150 may have excellent light emission, without a substantial increase in driving voltage.

When the EML 150 comprises a phosphorescent dopant, a hole blocking layer (HBL) (not shown) may be formed on the EML 150, by using vacuum deposition, spin coating, slot-die coating, printing, casting, LB deposition, or the like, in order to prevent the diffusion of triplet excitons or holes into the ETL 160. When the HBL is formed using vacuum deposition or spin coating, the conditions for deposition and coating may be similar to those for the formation of the HIL 130. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

The ETL 160 may be formed on the EML 150 or on the HBL if the HBL is formed. The ETL 160 includes a first layer 161 including a lithium halide or a lithium organic complex; and the second electron transport layer 162 comprises an elemental metal selected from the group of lithium, magnesium and/or ytterbium; or vice versa.

The ETL 160 has a stacked structure, preferably of two ETL-layers (161/162), so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL 160, the first layer 161 and the second layer 162 may have similar or identical energy levels. Surprisingly, it was found that the lifetime (LT) of the OLED 100 is improved irrespective of HOMO level of the matrix compounds.

In general the matrix compound for the first electron layer (161) and second electron layer (162) can be identical or different.

Matrix compound for the first electron layer (161) and second electron layer (162) that can be suitable used are selected from the group comprising anthracene compounds, preferably 2-(4-(9,10-di(naphthalen-2-yl)anthracen-2-yl)phenyl)-1-phenyl-1H-benzo[d]imidazole.

Anthracene compounds that can be used as matrix materials are disclosed in U.S. Pat. No. 6,878,469 B and incorporated by reference.

Other matrix compounds that can be used are diphenylphosphine oxide, preferably (3-(dibenzo[c,h]acridin-7-yl)phenyl)diphenylphosphine oxide, phenylbis (3-(pyren-1-yl) phenyl) phosphine oxide, 3-phenyl-3H-benzo[b]dinaphtho[2,1-d:1',2'-f]phosphepine-3-oxide, bis(4-(anthracen-9-yl) phenyl) (phenyl)phosphine oxide, phenyldi(pyren-1-yl) phosphine oxide.

Diphenylphosphine oxide compounds that can be used as matrix materials are disclosed in EP 2395571 A1, WO2013079217 A1, EP 13187905, EP13199361 and JP2002063989 A1, incorporated by reference. Other suitable matrix compounds that can be used are phenanthroline compounds, preferably selected from the group comprising of 2,4,7,9-tetraphenyl-1,10-phenanthroline and 2,9-di(biphenyl-4-yl)-4,7-diphenyl-1,10-phenanthroline. Phenanthroline compounds that can be used as matrix materials are disclosed in EP 1786050 A1 and incorporated by reference.

The matrix compound of the first electron layer (161) and/or second electron transport layer (162) may be a compound that efficiently transports electrons, such as an anthracene-based compound, diphenylphosphine oxide based compound, or a phenanthroline based compound, preferably a matrix compound mentioned in Table 1. For example, the matrix compound of the first electron layer (161) and/or second electron transport layer (162) may be selected from the group consisting of ADN and referred to as Formula 1, a compound represented by Formula 2, and a compound represented by Formula 3 below:

Formula 1 (ADN)

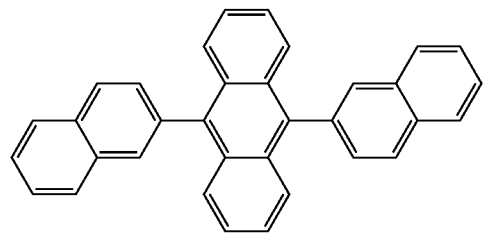

Formula 2

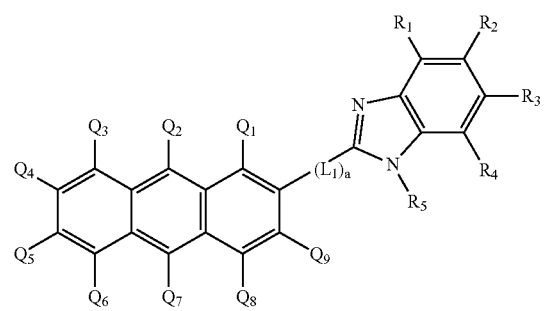

Formula 3

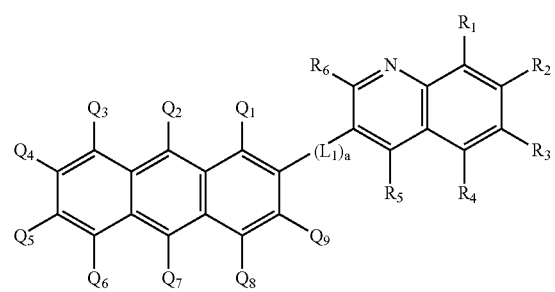

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, $L_1$ may be a phenylene group or a pyridinylene group. For example, "a" may be 1, 2, or 3.

The matrix compound may be further selected from Compound 6 or 7 below:

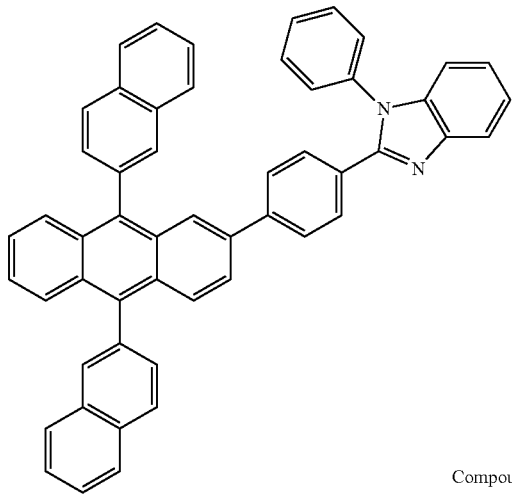 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

Compound 6

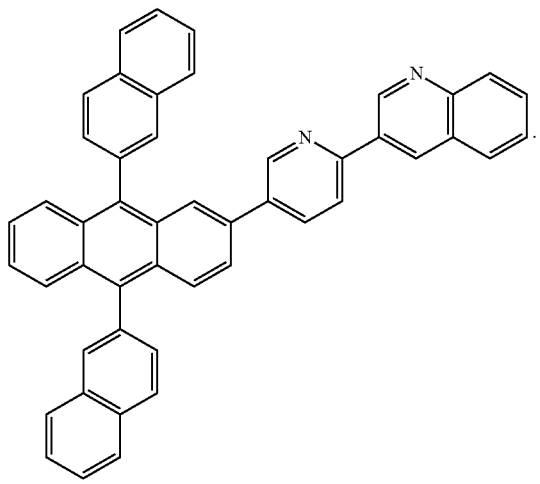

Compound 7

TABLE 1

| | Chemical structures of matrix materials that can be suitable used | | |
|---|---|---|---|
| Internal name | IUPAC name | Structure | Reference |
| MX 1 | 2-(4-(9,10-di(naphthalen-2-yl)anthracen-2-yl)phenyl)-1-phenyl-1H-benzo[d]imidazole | | US 6878469 B2 |

TABLE 1-continued

Chemical structures of matrix materials that can be suitable used

| Internal name | IUPAC name | Structure | Reference |
|---|---|---|---|
| MX 2 | (3-(dibenzo[c,h]acridin-7-yl)phenyl)diphenylphosphine oxide | | EP 2395571B1, WO2013079217A1 |
| MX 3 | Phenylbis(3-(pyren-1-yl)phenyl)phosphine oxide | | EP13187905.8 |
| MX 4 | 3-Phenyl-3H-benzo[b]dinaphtho[2,1-d:1',2'-f]phosphepine-3-oxide | | EP13199361.0 |
| MX 5 | Phenyldi(pyren-1-yl)phosphine oxide | | JP4876333 |

TABLE 1-continued

Chemical structures of matrix materials that can be suitable used

| Internal name | IUPAC name | Structure | Reference |
|---|---|---|---|
| MX 6 | 2,4,7,9-tetraphenyl-1,10-phenanthroline | | EP1786050 |
| MX 8 | 2,9-di(biphenyl-4-yl)-4,7-diphenyl-1,10-phenanthroline | | EP1786050 |
| MX 9 | bis(4-(anthracen-9-yl)phenyl)(phenyl)phosphine oxide | | EP13187905 |
| MX 10 | 4,7-diphenyl-2,9-di-p-tolyl-1,10-phenanthroline | | EP1786050 |

TABLE 1-continued

Chemical structures of matrix materials that can be suitable used

| Internal name | IUPAC name | Structure | Reference |
|---|---|---|---|
| MX 11 | 1-(4-(10-([1,1'-biphenyl]-4-yl)anthracen-9-yl)phenyl)-2-ethyl-1H-benzo[d]imidazole | | WO2010134352 |

Reduction and oxidation potentials are determined via cyclic voltammetry, using the Ferrocene/Ferrocenium (Fc/Fc$^+$) redox couple as internal reference. A simple rule is very often used for the conversion of redox potentials into electron affinities and ionization potential: IP (in eV)=4.84 eV+e*Eox (wherein Eox is given in Volt vs. ferrocene/ferrocenium (Fc/Fc$^+$) and EA (in eV)=4.84 eV+e*Ered (Ered is given in Volt vs. Fc/Fc$^+$) respectively (see B. W. D'Andrade, Org. Electron. 6, 11-20 (2005)), e* is the elemental charge. It is common practice, even if not exactly correct, to use the terms "energy of the HOMO" E(HOMO) and "energy of the LUMO" E(LUMO), respectively, as synonyms for the ionization energy and electron affinity (Koopmans Theorem).

Table 2 below shows the energy levels of matrix compounds which may be suitably used according to the invention.

TABLE 2

Reduction and oxidation potential and energy of E(HOMO) and E(LUMO) of matrix materials

| Matrix compound | Oxidation potential vs Fc/Fc$^+$/V | E(HOMO)/ eV | Reduction potential vs Fc/Fc$^+$/V | E(LUMO)/ eV |
|---|---|---|---|---|
| MX1 | >1.6 | <−6.45 | −2.32 | −2.52 |
| MX2 | 1.26 | −6.1 | −2.2 | −2.64 |
| MX4 | >1.6 | <−6.45 | −2.62 | −2.22 |
| MX3 | 0.83 | −5.67 | −2.48 | −2.36 |
| MX9 | | | −2.42 | −2.42 |
| MX10 | | | −2.37 | −2.47 |
| MX11 | | | −2.41 | −2.38 |

The first electron transport layer 161 comprises a lithium halide or a lithium organic complex; and the second electron transport layer 162 comprises an elemental metal selected from the group of lithium, magnesium, and/or ytterbium.

According to another aspect the first electron transport layer 161 comprises an elemental metal selected from the group of lithium, magnesium and/or ytterbium; and the second electron transport layer 162 comprises a lithium halide or a lithium organic complex.

According to another aspect the first electron transport layer 161 comprises a lithium halide or a lithium organic complex; and the second electron transport layer 162 comprises an elemental metal selected from the group of lithium, magnesium and/or ytterbium; and the third electron transport layer 163 comprises a lithium halide or a lithium organic complex that is the same or differs from the lithium halide or lithium organic complex of the first electron transport layer 161.

According to another aspect the first electron transport layer 161 comprises an elemental metal selected from the group of lithium, magnesium and/or ytterbium; and the second electron transport layer 162 comprises a lithium halide or a lithium organic complex; and the third electron transport layer 163 comprises an elemental metal selected from the group of lithium, magnesium and/or ytterbium that is the same or differs from the elemental metal selected from the group of lithium, magnesium and/or ytterbium of the first electron transport layer 161.

Suitable organic ligands to form a lithium organic complex that can be used for the first electron transport layer or the second electron transport layer are disclosed, and incorporated by reference, for example in WO 2013079676 A1, WO 2013079678 A1 and EP 2724388 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

TABLE 3

Lithium organic complex that can be suitable used

| | IUPAC name | Structure | Reference |
|---|---|---|---|
| LiQ | lithium 8-hydroxyquinolate | | WO 2013079217 A1 |

TABLE 3-continued

| | Lithium organic complex that can be suitable used | | |
|---|---|---|---|
| IUPAC name | | Structure | Reference |
| Li-1 | lithium tetra(1H-pyrazol-1-yl)borate | | WO 2013079676 A1 |
| Li-2 | lithium 2-(diphenyl-phosphoryl)phenolate | | WO 2013079678A1 |
| Li-3 | lithium 2-(pyridin-2-yl)phenolate | | JP2 008195623 |
| Li-4 | lithium 2-(1-phenyl-1H-benzo[d]imidazol-2-yl)phenolate | | JP 2001291593 |
| Li-5 | lithium 2-(benzo[d]oxazol-2-yl)phenolate | | US 20030165711 |
| Li-6 | lithium 2-(diphenyl-phosphoryl)pyridin-3-olate | | EP 2724388 |

The organic ligand of the lithium organic complex of at least one electron transport layer may be selected from the group comprising a quinolate, a borate, a phenolate, a pyridinolate or a Schiff base ligand, or Table 3;
preferably the lithium quinolate complex has the formula I:

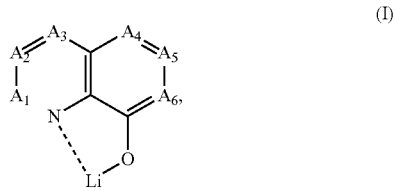

wherein
A1 to A6 are same or independently selected from CH, CR, N, O;
R is same or independently selected from hydrogen, halogen, alkyl or aryl or heteroaryl with 1 to 20 carbon atoms; and more preferred A1 to A6 are CH;
preferably the borate based organic ligand is a tetra(1H-pyrazol-1-yl)borate;
preferably the phenolate is a 2-(pyridin-2-yl)phenolate or a 2-(diphenylphosphoryl)phenolate;
preferably the lithium Schiff base has the structure 100, 101, 102 or 103:

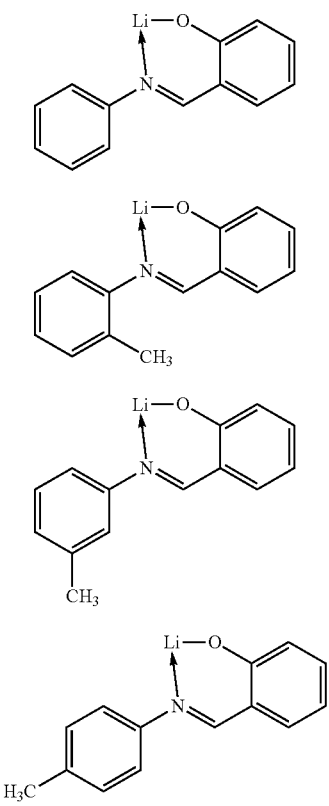

more preferred the lithium organic complex is selected from a compound of Table 2.
The lithium halide of at least one electron transport layer may be selected from the group comprising a LiF, LiCl, LiBr or LiJ, and preferably LiF.

The ETL layer stack thickness can be adjusted such that the light out coupling is maximized. Further ETL layer stack thickness can be adjusted for the desired color tuning, for example to achieve a deeper shade of blue, i.e. smaller CIEy.

The thicknesses of the first electron transport layer 161, second electron transport layer 162 and/or third electron transport layer 163 may be the same or each independently in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

When the thicknesses of the first electron transport layer 161, second electron transport layer 162 and/or third electron transport layer 163 within this range, preferably of about ≥10 nm to about ≤18 nm, the electron transport layer stack 160 may effectively inject and transport electrons, without a substantial increase in driving voltage.

For blue emitting OLEDs, the thickness of the ETL layer stack is 10 to 50 nm, preferably 30 to 40 nm. For red and green emitting OLEDs, the thickness of ETLs is 20 to 100 nm, preferably 20-100 nm and more preferably 30-80 nm. The thickness is selected so as to maximize efficiency of light emission.

The amount of the lithium organic complex in at least one electron transport layer (161) may be in the range of about ≥10 mol-% to about ≤95 mol-%, preferably about ≥15 mol-% to about ≤90 mol-% and also preferred about ≥20 mol-% to about ≤80 mol-%, of the first electron transport layer 161.

The amount of an elemental metal selected from the group of lithium, magnesium, and/or ytterbium in the second electron transport layer 162 may be in the range of about ≥1 wt.-% to about ≤60 wt.-%, preferably about ≥2 wt.-% to about ≤55 wt.-% and also preferred about ≥5 wt.-% to about ≤45 wt.-%, by weight of the second electron transport layer 162.

The amount of the lithium halide or lithium organic complex in the first electron transport layer 161 may be in the range of about ≥10 mol-% to about ≤95 mol-%, preferably about ≥15 mol-% to about ≤90 mol-% and also preferred about ≥20 mol-% to about ≤80 mol-%, of the first electron transport layer 161.

The amount of an elemental metal selected from the group of lithium, magnesium, and/or ytterbium in the second electron transport layer 162 may be in the range of about ≥10 mol-% to about ≤90 mol-%, preferably about ≥20 mol-% to about ≤85 mol-% and also preferred about ≥30 mol-% to about ≤80 mol-%.

However, the first electron transport layer 161 may comprises the elemental metal and the second electron transport layer 162 may comprises the lithium halide or lithium organic complex.

The ETL 160 may be formed on the EML 150 by vacuum deposition, spin coating, slot-die coating, printing, casting, or the like. When the ETL 160 is formed by vacuum deposition or spin coating, the deposition and coating conditions may be similar to those for formation of the HIL 130. However, the deposition and coating conditions may vary, according to a compound that is used to form the ETL 160.

Using vacuum deposition, the first electron transport layer 161 of the ETL 160 may be formed using a first deposition source to deposit a matrix compound, and a second deposition source to deposit a lithium halide or lithium organic complex. The first deposition source and the second deposition source are positioned relative to one another, such that a mixed deposition region of the first electron transport layer 161 is formed directly on the EML 150.

The second electron transport layer 162 of the ETL 160 may be formed using a first or a third deposition source, for example if the matrix material is different to the ETL 161, and a third or fourth deposition source is used to deposit the elemental metal selected from the group of lithium, magnesium and/or ytterbium.

The deposition sources are positioned relative to one another, such that a mixed deposition region of the second electron transport layer 162 is formed directly on the first electron transport layer 161.

The stacking process is more simply and quickly performed, as compared to prior methods. In particular, since a plurality of ETL layers may be almost simultaneously deposited in a single chamber, the chamber may not be required to be exhausted after the formation of each layer.

The EIL 180, which facilitates injection of electrons from the cathode, may be formed on the ETL 160, preferably directly on the second electron transport layer 162. Examples of materials for forming the EIL 180 include LiF, NaCl, CsF, Li2O, BaO, Ca, Ba, Yb, Mg which are known in the art. Deposition and coating conditions for forming the EIL 180 are similar to those for formation of the HIL 130, although the deposition and coating conditions may vary, according to a material that is used to form the EIL 180.

The thickness of the EIL 180 may be in the range of about 0.1 nm to 10 nm, for example, in the range of 0.5 nm to 9 nm. When the thickness of the EIL 180 is within this range, the EIL 180 may have satisfactory electron-injecting properties, without a substantial increase in driving voltage.

The second cathode electrode 190 is formed on the EIL 180 if present. The second cathode electrode 190 may be a cathode, which is an electron-injecting electrode. The second electrode 190 may be formed of a metal, an alloy, an electrically conductive compound, or a mixture thereof. The second electrode 190 may have a low work function. For example, the second electrode 190 may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the second electrode 190 may be formed of a transparent conductive material, such as ITO or IZO.

The thickness of the cathode electrode 190 may be in the range of about 5 nm to 1000 nm, for example, in the range of 10 nm to 100 nm. When the cathode electrode 190 is in the range of 5 nm to 50 nm, the electrode will transparent even if a metal or metal alloy is used.

Since the layers of the ETL 160 have similar or identical energy levels, the injection and transport of the electrons may be controlled, and the holes may be efficiently blocked. Thus, the OLED 100 may have long lifetime.

Figure 5:
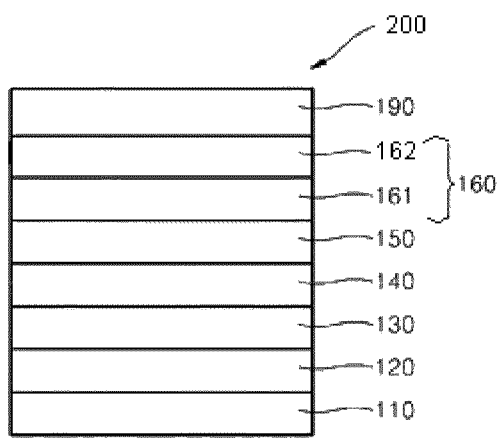
FIG. 5 is a schematic sectional view of an OLED, according to an exemplary embodiment of the present invention with two electron transport layers and having no electron injection layer (EIL)
Figure 6:
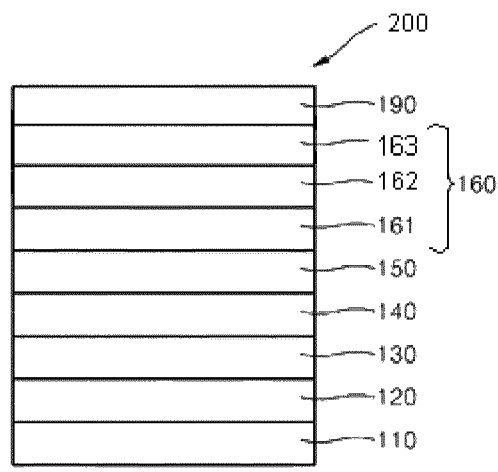
FIG. 6 is a schematic sectional view of an OLED, according to an exemplary embodiment of the present invention with three electron transport layers and having no electron injection layer (EIL)

FIGS. 5 and 6 is a schematic sectional view of an OLED 200, according to another exemplary embodiment of the present invention. FIGS. 3 and 4 differ from FIGS. 5 and 6 in that the OLED 200 has no electron injection layer (EIL) 180.

Referring to FIGS. 5 and 6 the OLED 200 includes a substrate 110, a first electrode 120, a HIL 130, a HTL 140, an EML 150, an ETL 160, and a second electrode 190. The ETL stack 160 of FIG. 5 includes a first ETL layer 161 and a second ETL layer 162 and the ETL stack 160 of FIG. 6 includes a first ETL layer 161, a second ETL layer 162 and a third ETL layer 163.

The electron transport layer stack 160 of FIG. 5 comprises of at least two electron transport layers 161 and 162, wherein a first electron transport layer 161 and a second electron transport layer 162 comprises at least one matrix compound and in addition, the first electron transport layer comprises a lithium halide or a lithium organic complex, and the second electron transport layer comprises an elemental metal selected from the group of lithium, magnesium and/or ytterbium; wherein the first electron transport layer is arranged closest to an anode and the second electron transport layer is arranged closest to a cathode.

The electron transport layer stack 160 of FIG. 6 comprises of at least three electron transport layers 161, 162 and 163, wherein a first electron transport layer 161, a second electron transport layer 162 and a third electron transport layer 163 comprises at least one matrix compound and in addition, the first electron transport layer 161 and third electron transport layer 163 comprises a lithium halide or a lithium organic complex, and the second electron transport layer 162 comprises an elemental metal selected from the group of lithium, magnesium and/or ytterbium; wherein the first electron transport layer 161 is arranged closest to an anode and the third electron transport layer 163 is arranged closest to a cathode.

The layers of the ETL 161 and 162 or of the ETL 161, 162 and 163 have similar or identical energy level. Further, the OLED 200 have an improved lifetime (LT). The substrate 110, the first electrode 120, the hole injection layer 130, the hole transport layer 140, the emission layer 150, and the electron transport layer 161 and 162 of the OLED 200 of FIG. 5 or the electron transport layer 161, 162 and 163 of the OLED 200 of FIG. 6 are similar to corresponding elements described with reference to FIGS. 3 and 4, respectively. Even though the structure of the OLED 200 and the method of manufacturing the OLED 200 are described with reference to FIGS. 3 and 4, other methods known in the art can be used. For example, the ETL stack 160 may include three or more ETL layers but two ETL layers of ETL 161 and 162 may be preferred.

In the description above the method of manufacture an OLED of the present invention is started with a substrate 110 onto which a first anode electrode 120 is formed, on the first anode electrode 120 an emission layer 150 is formed. An electron transport layer stack 160 is formed on the emission layer 150, wherein the first electron transport layer 161 is formed on the emission layer 150 and the second electron transport layer 162 is formed directly on the first electron transport layer 161, on the electron transport layer stack 160, in this case on the second electron transport layer 162, a cathode electrode 190 is formed, optional a hole injection layer 130, and a hole transport layer 140, are formed in that order between the first anode electrode 120 and the electron transport layer stack 160, an optional hole blocking layer is arranged between the emission layer and the ETL layer stack, and optionally an electron injection layer 180 is arranged between the electron transport layer 160 and the second cathode electrode 190.

However, the OLED of the present invention can be manufactured also the other way around, starting with the second cathode electrode 190 onto which optionally an electron injection layer 180 is formed. On the second cathode electrode 190 or on the electron injection layer 180, if present, the second electron transport layer 162 is formed and directly on the second electron transport layer 162 the first electron transport layer 161 is formed and so on.

In case of a three layer electron transport layer stack 160, the second electron layer 162 is formed on the first electron layer 161 and the third electron layer 163 is formed on the second electron layer 162. Then a cathode electrode 190 is formed, optional a hole injection layer 130, and a hole transport layer 140, are formed in that order between the first anode electrode 120 and the electron transport layer stack 160, an optional hole blocking layer is arranged between the emission layer and the ETL layer stack, and optionally an electron injection layer 180 is arranged between the electron transport layer 160 and the second cathode electrode 190.

According to another embodiment the electron transport layer stack 160 may form part of a charge generation layer (CGL).

The term "charge generation layer" also named "CGL" stands for a layer structure of a second electron transport layer adjacent arranged to a hole injection layer, or a layer structure of a second electron transport layer adjacent arranged to an interlayer that is adjacent arranged to a hole injection layer.

According to one embodiment of an OLED comprising a charge generation layer, the first electron transport layer comprised a Li organic complex and/or Li halide, and the second electron transport layer, which is part of the charge generation layer, comprises an elemental metal selected from the group of lithium, magnesium and/or ytterbium.

The optional interlayer comprises CN-HAT (CAS 105598-27-4) or CuPc. The interlayer can be used to increase lifetime of the OLED-device. Suitable interlayer compounds are disclosed in WO 2010/132236 A1 and are fully incorporated by reference.

According to one aspect an OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first emission layer, the first emission layer is adjacent arranged to a first electron transport layer, the first electron transport layer is adjacent arranged to a second electron transport layer, the second electron transport layer is adjacent arranged to an interlayer, the interlayer is adjacent arranged to a second hole injection layer, the second hole injection layer is adjacent arranged to a second hole transport layer, the second hole transport layer is adjacent arranged to a second emission layer, between the second emission layer and the cathode electrode an optional electron transport layers and/or an optional injection layer are arranged.

According to another aspect an OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first emission layer, the first emission layer is adjacent arranged to a first electron transport layer, the first electron transport layer is adjacent arranged to a second electron transport layer, the second electron transport layer is adjacent arranged to a second hole injection layer, the second hole injection layer is adjacent arranged to a second hole transport layer, the second hole transport layer is adjacent arranged to a second emission layer, between the second emission layer and the cathode electrode an optional electron transport layers and/or an optional injection layer are arranged.

According to another aspect the OLED may comprise the following layers arranged in the order:

substrate/anode electrode/first hole injection layer/first hole transport layer/first emission layer/first ETL/second ETL/optional interlayer/second hole injection layer/second hole transport layer/second emission layer/optional electron transport layers/optional injection layers/cathode electrode.

According to another aspect the OLED may comprise the following layers arranged in the order of a substrate, an anode electrode, a first hole injection layer, a first hole transport layer, a first emission layer, a first electron transport layer, a second electron transport layer, an optional interlayer, a second hole injection layer, a second hole transport layer, optional a triplet control layer a second emission layer, an optional electron transport layer, optional a third electron transport layer, an optional injection layer, and a cathode electrode.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1, and fully incorporated here by reference.

Figure 7:
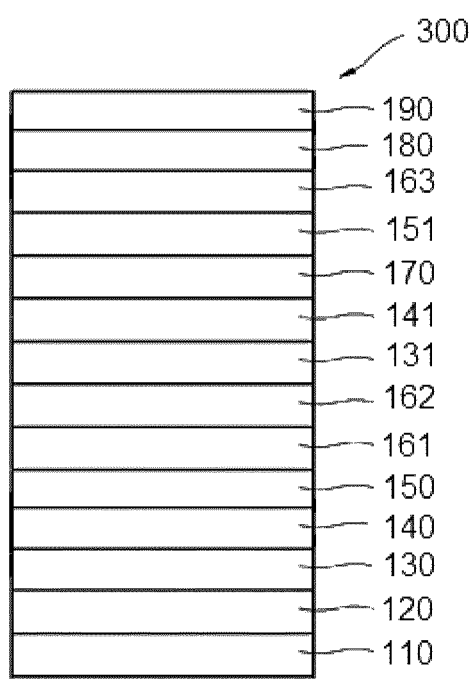
FIG. 7 is a schematic sectional view of a tandem OLED, according to an exemplary embodiment of the present invention.

FIG. 7 shows a tandem OLED 300 that comprises a layer structure in the following order:
Substrate 110/anode electrode 120/first hole injection layer 130/first hole transport layer 140/first emission layer fluorescent blue emitting layer 150/first electron transport layer 161/second electron transport layer 162/second hole injection layer 131/second hole transport layer 141/triplet control layer 170/second emission layer phosphorescent green emitting layer 151/third electron transport layer 163/electron injection layer 180/ and a cathode electrode 190.

According to another aspect the OLED may comprise the following layers arranged in the order of a substrate, an anode electrode, a first hole injection layer, a first hole transport layer, optional a first triplet control layer, a first emission layer, a first electron transport layer, a second electron transport layer, an optional interlayer, a second hole injection layer, a second hole transport layer, optional a second triplet control layer, a second emission layer, an optional electron transport layer, optional a third electron transport layer, an optional injection layer, and a cathode electrode.

An OLED comprising two or more emission layers and one or more charge generation layers may be described as tandem OLED or stacked OLED.

While not shown in FIGS. 3 to 7, a sealing layer may further be formed on the second electrodes 190, in order to seal the OLEDs 100, 200, 300. In addition, various other modifications may be applied thereto.

Hereinafter, one or more exemplary aspects will be described in detail with, reference to the following examples. However, these examples are not intended to limit the purpose and scope of the one or more exemplary aspects.

EXAMPLES

General Procedure for OLEDs with One Emission Layer (Single OLED)

For bottom emission devices, a 15 $\Omega/cm^2$ glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

For top emission devices, the anode electrode was formed from 100 nm silver on glass which was prepared by the same methods as described above.

Then, 80 wt.-% of N4,N4"-di(naphthalen-1-yl)-N4,N4"-diphenyl-[1,1':4',1"-terphenyl]-4,4"-diamine and 20 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then N4,N4"-di(naphthalen-1-yl)-N4,N4"-diphenyl-[1,1': 4',1"-terphenyl]-4,4"-diamine was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then the ETL-layer stack is formed by depositing the first electron transport layer (ETL 1) including a matrix compound according to Example 1 to Example 21 and comparative examples 2 to 5 by deposing the matrix compound from a first deposition source and the lithium organic complex or lithium halide of from a second deposition source directly on the EML.

Then the second electron transport layer (ETL 2) including a matrix compound according to Example 1 to Example 28 and comparative examples 1 to 9 is formed by deposing the matrix compound from a first deposition source, if the same matrix compound is used as in the first electron transport layer, or a third deposition source, if the matrix compound is different from the matrix compound used in the first electron transport layer.

A lithium organic complex or lithium halide is deposed from a third deposition source directly on the first electron transport layer (ETL 1) and an elemental metal selected from the group of lithium, magnesium and/or ytterbium is deposed from a fourth deposition source directly on the second electron transport layer (ETL 2).

For an electron transport layer with three electron transport layers (ETL 1, ETL 2 and ETL 3) the corresponding electron transport layer is formed as described above.

For the comparative examples 1and 2 only one electron transport layer ETL 2 is formed and for the other comparative examples two electron transport layers of ETL 1 and ETL 2 are formed.

The wt.-% of the lithium organic complex for the ETL1 as well as for the ETL 2 can be taken from Tables 4 to 10, whereby the wt.-% amount of the matrix compound is added to 100 wt.-% respectively. That means, that the matrix compound of ETL 1 are added in a wt.-% amount such that the given wt.-% of the lithium organic complex for the ETL1 and the matrix compound of the ETL 1 are in total 100 wt.-%, based on the weight of the ETL 1; and, the matrix compound of ETL 2 are added in a wt.-% amount such that the given wt.-% of the elemental metal selected from the group of lithium, magnesium and/or ytterbium for the ETL2 and the matrix compound of the ETL 2 are in total 100 wt.-%, based on the weight of the ETL 2. Further, the thickness d (in nm) of the ETL 1 and ETL 2 can be taken from Tables 4 to 10. The cathode was evaporated at ultrahigh vacuum of $10^{-7}$ bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For top emission devices, the cathode electrode was formed from 13 nm magnesium (90 vol.-%)-silver (10 vol.-%) alloy, followed by 60 nm N4,N4"-di(naphthalen-1-yl)-N4,N4"-diphenyl-[1,1':4',1"-terphenyl]-4,4"-diamine. For bottom emission devices, the cathode electrode was formed from 100 nm aluminum.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 15 mA/cm$^2$, a calibrated spectrometer CAS140 from Instrument Systems is used for measurement of CIE coordinates and brightness in Candela. Lifetime LT of the device is measured at ambient conditions (20° C.) and 15 mA/cm$^2$, using a Keithley 2400 sourcemeter, and recorded in hours. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the EQE in % the light output of the device is measured using a calibrated photo-diode at 10 mA/cm$^2$.

In top emission devices, the emission is forward directed, non-Lambertian and also highly dependent on the micro-cavity. In order to minimize the effect of the micro-cavity and thus of the emission color on the device performance, the efficiency Eff. is measured in Candela per Ampere (cd/A) and divided by the CIE-y.

In tandem OLED devices, two or more emission layers are present and there is a higher probability of holes and electrons recombining to form excitons. Therefore, the efficiency EQE of tandem OLEDs is significantly higher than of single OLEDs comprising just one emission layer.

Technical Effect of the Invention

Bottom Emission Single OLED Devices
a) Lifetime and Efficiency Improvement with Two Electron Transport Layers (ETL1 and ETL 2)

In Table 4 results are shown for top emission devices with two different matrix compounds in the ETL-stack of first electron transport layer (ETL1) and second electron transport layer (ETL 2). An external quantum efficiency (EQE) and lifetime improvement is observed compared to the emission device with one electron transport layer only— Table 4.

TABLE 4

External quantum efficiency (EQE) and lifetime of bottom emission OLEDs with two ETLs

| | ETL1 | wt.-% Li organic complex*[1] | d (ETL1)/ nm | ETL2 | wt.-% Li organic complex*[1] | wt.-% Metal dopant*[2] | d (ETL2)/ nm | V at 10 mA/cm²/V | EQE/ % | LT/ h |
|---|---|---|---|---|---|---|---|---|---|---|
| Comp. example 1 | | none | | MX2:Mg | | 5 | 36 | 3.70 | 4.20 | 10 |
| Comp. example 2 | | none | | MX2:LiQ:Mg | 47.5 | 5 | 36 | 3.79 | 5.83 | 12 |
| Example 1 | MX2:LiQ | 50 | 26 | MX2:Mg | | 5 | 11 | 4.33 | 6.25 | 130 |

*[1]= the wt.-% of the matrix compound and the wt.-% of the lithium organic complex are in total 100 wt.-% based on weight of the ETL1
*[2]= the wt.-% of the matrix compound and the wt.-% of the elemental metal are in total 100 wt.-% based on weight of the ETL2

In the Table 4 above a device data for a single ETL device compared to a device containing two electron transport layers is shown. As can be seen, the lifetime and efficiency are improved for devices with two electron transport layers according to the invention compared to devices with just one electron transport layer (Comparative example 1).

The lifetime and efficiency are also improved when comparing a single ETL device comprising lithium organic complex and magnesium in the one electron transport layer compared to a device with two electron transport layers where the lithium organic complex is present in the first electron transport layer and magnesium in the second electron transport layer (Comparative example 2).

TABLE 5

External quantum efficiency (EQE) and lifetime of bottom emission OLEDs with two ETLs

| | ETL1 | wt.-% Li organic complex*[1] | d (ETL1)/ nm | ETL2 | wt.-% Metal dopant*[2] | d (ETL2)/ nm | V at 10 mA/cm²/V | EQE/ % | LT/ h |
|---|---|---|---|---|---|---|---|---|---|
| Comparative example 3 | MX1:LiQ | 50 | 19 | MX1:Ca | 5 | 17 | 3.77 | 5.48 | 55 |
| Example 2 | MX1:LiQ | 50 | 10 | MX1:Mg | 5 | 26 | 7.20 | 4.72 | 130 |
| Example 3 | MX2:LiQ | 50 | 26 | MX2:Mg | 5 | 11 | 4.33 | 6.25 | 130 |
| Example 4 | MX2:LiQ | 50 | 26 | MX2:Yb | 5 | 10 | 4.52 | 5.79 | 170 |
| Example 5 | MX2:LiQ | 50 | 20 | MX2:Li | 5 | 16 | 4.37 | 6.15 | 150 |

*[1]= the wt.-% of the matrix compound and the wt.-% of the lithium organic complex are in total 100 wt.-% based on weight of the ETL1
*[2]= the wt.-% of the matrix compound and the wt.-% of the elemental metal are in total 100 wt.-% based on weight of the ETL2

In the Table 5 above results for external quantum efficiency and lifetime are shown for devices containing benzimidazole matrix compound MX 1 in the first and second electron transport layer. In comparison to comparative example 3, a significant improvement in lifetime is observed when calcium is replaced by magnesium in the second electron transport layer (Example 2). When benzimidazole matrix compound MX 1 is replaced by phosphine oxide matrix compound MX 2 very good lifetime is maintained, and the external quantum efficiency is improved (Example 3 compared to Example 2). Additionally, the voltage is much reduced in Example 3 compared to Example 2. A further increase in lifetime is achieved when magnesium is replaced with lithium and ytterbium (Examples 4 and 5).

TABLE 6

External quantum efficiency (EQE) and lifetime of bottom emission OLEDs with two ETLs

| | ETL1 | wt.-% Li organic complex*[1] | d (ETL1)/ nm | ETL2 | wt.-% Metal dopant*[2] | d (ETL2)/ nm | V at 10 mA/cm²/V | EQE/ % | LT/ h |
|---|---|---|---|---|---|---|---|---|---|
| Example 6 | MX2:LiQ | 50 | 26 | MX2:Mg | 5 | 11 | 4.33 | 6.25 | 130 |
| Example 7 | MX2:LiQ | 50 | 26 | MX2:Yb | 5 | 10 | 4.52 | 5.79 | 170 |
| Example 8 | MX4:Li-2 | 60 | 26 | MX4:Mg | 5 | 10 | 4.52 | 6.59 | 150 |
| Example 9 | MX9:Li-2 | 50 | 21 | MX9:Mg | 5 | 15 | 4.21 | 5.50 | 140 |

TABLE 6-continued

External quantum efficiency (EQE) and lifetime of bottom emission OLEDs with two ETLs

| | ETL1 | wt.-% Li organic complex*1 | d (ETL1)/ nm | ETL2 | wt.-% Metal dopant*2 | d (ETL2)/ nm | V at 10 mA/cm2/V | EQE/ % | LT/ h |
|---|---|---|---|---|---|---|---|---|---|
| Example 10 | MX9:Li-2 | 50 | 26 | MX9:Yb | 5 | 10 | 4.69 | 5.42 | 300 |
| Example 11 | MX9:Li-2 | 50 | 16 | MX9:Yb | 5 | 20 | 4.47 | 5.39 | 220 |

*1= the wt.-% of the matrix compound and the wt.-% of the lithium organic complex are in total 100 wt.-% based on weight of the ETL1
*2= the wt.-% of the matrix compound and the wt.-% of the elemental metal are in total 100 wt.-% based on weight of the ETL2

In the Table 6 above a comparison is shown of various phosphine oxide matrix compounds and lithium organic complex Li-2. The lifetime is improved for both magnesium and ytterbium compared to comparative examples 1, 2 and 3. As can be seen in Example 10, a lifetime improvement is observed even for a thicker first electron transport layer and a thinner second electron transport layer. As can be seen in Example 11, a lifetime improvement is observed even for a thinner first electron transport layer and a thicker second electron transport layer. The best lifetime in Table 6 is achieved for 26 nm first ETL and 10 nm second ETL, see Example 10. Depending on the matrix compound, an increase in efficiency can also be observed, for example matrix compound MX4 of Example 8 gives higher external quantum efficiency (EQE) than MX2 or MX9.

In summary, improved lifetime is observed for magnesium, ytterbium and lithium in the second electron transport layer compared to the devices of comparative examples where calcium has been used. For certain combinations of matrix compounds and lithium organic complex, an increase in efficiency has been achieved according to the invention, for example MX2, doped with LiQ, and MX4, doped with Li-2.

In Table 7 below a bottom-emission device with the same matrix material in the first and second electron transport layer is compared with a device of a first matrix compound in the first electron transport layer and a different second matrix compound in the second electron transport layer.

TABLE 7

External quantum efficiency (EQE) and lifetime of bottom emission OLEDs with two ETLs

| | ETL1 | wt.-% Li organic complex*1 | d (ETL1)/ nm | ETL2 | wt.-% Metal dopant*2 | d (ETL2)/ nm | V at 10 mA/cm2/V | EQE/ % | LT/ h |
|---|---|---|---|---|---|---|---|---|---|
| Example 12 | MX2:LiQ | 50 | 26 | MX2:Mg | 5 | 11 | 4.33 | 6.25 | 130 |
| Example 13 | MX3:LiQ | 60 | 20 | MX2:Mg | 5 | 16 | 4.92 | 5.27 | 200 |

*1= the wt.-% of the matrix compound and the wt.-% of the lithium organic complex are in total 100 wt.-% based on weight of the ETL1
*2= the wt.-% of the matrix compound and the wt.-% of the elemental metal are in total 100 wt.-% based on weight of the ETL2

In the Table 7 above results for devices wherein the HOMO level of the first matrix compound is about 0.43 eV shallower (shallower means closer to vacuum level) compared to the second matrix compound of Example 13. Additionally, the LUMO level of the first matrix compound is about 0.28 eV shallower (closer to vacuum level) than the LUMO of the second matrix compound. The lifetime is increased compared to devices with the same matrix compound in both ETL layers.

In Table 8 below a comparison of two matrix materials is shown, wherein the first matrix material has a deeper HOMO level than the second matrix material.

TABLE 8

External quantum efficiency (EQE) and lifetime of bottom emission OLEDs with two ETLs

| | ETL1 | wt.-% Li organic complex*1 | d (ETL1)/ nm | ETL2 | wt.-% Metal dopant*2 | d (ETL2)/ nm | V at 10 mA/cm2/V | EQE/ % | LT/ h |
|---|---|---|---|---|---|---|---|---|---|
| Example 14 | MX4:Li-2 | 60 | 20 | MX4:Mg | 5 | 16 | 4.40 | 6.57 | 130 |
| Example 15 | MX4:Li-2 | 60 | 20 | MX2:Mg | 5 | 16 | 4.52 | 6.36 | 145 |

*1= the wt.-% of the matrix compound and the wt.-% of the lithium organic complex are in total 100 wt.-% based on weight of the ETL1
*2= the wt.-% of the matrix compound and the wt.-% of the elemental metal are in total 100 wt.-% based on weight of the ETL2

In the Table 8 above results for bottom emission devices wherein the HOMO level of the first matrix compound of Example 14 is about >0.35 eV deeper (deeper means further away from vacuum level) compared to the second matrix compound of Example 15 is shown. The LUMO level of the first matrix compound is about 0.42 eV shallower compared to the LUMO level of the second matrix compound. Again, the lifetime is improved over the device with the same matrix compound in both ETL layers. In summary, a significant lifetime improvement is achieved irrespective of the off-set in HOMO level between the first and second matrix compound.

In Table 9 below bottom emission devices are compared with various cathode materials of aluminum and silver with a thickness of 100 nm.

TABLE 9

External quantum efficiency (EQE) and lifetime of bottom emission OLEDs with two ETLs

| | ETL1 | wt.-% Lithium organic complex *[1] | d (ETL1)/ nm | ETL2 | wt.-% Metal dopant *[2] | d (ETL2)/ nm | Cathode | V at 10 mA/cm$^2$/V | EQE/ % | LT/ h |
|---|---|---|---|---|---|---|---|---|---|---|
| Comp. example 4 | MX1:LiQ | 50 | 19 | MX1:Ca | 5 | 17 | Al | 3.77 | 5.48 | 55 |
| Comp. example 5 | MX1:LiQ | 50 | 19 | MX1:Ca | 5 | 16 | Ag | 3.66 | 4.89 | 47 |
| Example 16 | MX2:LiQ | 50 | 26 | MX2:Mg | 5 | 11 | Al | 4.33 | 6.25 | 130 |
| Example 17 | MX2:LiQ | 50 | 20 | MX2:Mg | 5 | 16 | Ag | 4.06 | 5.25 | 100 |

*[1] = the wt.-% of the matrix compound and the wt.-% of the lithium organic complex are in total 100 wt.-% based on weight of the ETL1
*[2] = the wt.-% of the matrix compound and the wt.-% of the elemental metal are in total 100 wt.-% based on weight of the ETL2

In Table 9 above bottom-emission devices are shown with Al and Ag cathode.

As can be seen for Comparative Examples 4 and 5, the lifetime with Ag cathode is slightly shorter compared to the Al cathode. When phosphine oxide host matrix MX2 is used in both layers and ETL 2 contains Mg, the lifetime with both Al and Ag cathode is significantly improved over the Comparative Examples 4 and 5.

Lifetime and efficiency improvement with three electron transport layers (ETL1, ETL 2, and ETL 3).

In Table 10 below are shown voltages for OLEDs with different thicknesses of ETL2, while keeping the thickness of ETL1 constant.

TABLE 10

Voltage at 10 mA/cm$^2$ of bottom emission OLEDs with different thicknesses of ETL1 and ETL2

| | ETL1 | wt.-% Lithium organic complex*[1] | d (ETL1)/ nm | ETL2 | wt.-% Metal dopant*[2] | d (ETL2)/ nm | V at 10 mA/cm$^2$/V |
|---|---|---|---|---|---|---|---|
| Example 18 | MX2:LiQ | 50 | 20 | MX2:Mg | 5 | 16 | 4.09 |
| Example 19 | MX2:LiQ | 50 | 20 | MX2:Mg | 5 | 56 | 4.09 |
| Example 20 | MX2:LiQ | 50 | 20 | MX2:Mg | 5 | 96 | 4.1 |
| Example 21 | MX2:LiQ | 50 | 20 | MX2:Mg | 5 | 136 | 4.09 |

*[1]= the wt.-% of the matrix compound and the wt.-% of the lithium organic complex are in total 100 wt.-% based on weight of the ETL1
*[2]= the wt.-% of the matrix compound and the wt.-% of the elemental metal are in total 100 wt.-% based on weight of the ETL2

As can be seen in Table 10 above, the voltage does not change with the thickness of the electron transport layer containing elemental metal (ETL2). Even when the thickness of ETL2 is increased from 16 to 136 nm, the voltage does not increase (Examples 18 and 21). In manufacturing, this is a very important feature as it allows fine-tuning of the micro-cavity through optimisation of the layer thickness without loss in conductivity. The micro-cavity influences the emission spectrum and efficiency of an OLED. In devices with an electron transport layer containing elemental metal, the thickness of this layer can be adjusted to optimize the emission spectrum and efficiency without increase in voltage.

In Table 11 below a comparison of two matrix materials is shown, wherein the first matrix material is selected from a anthracene or phenanthroline compound and the second matrix compound is selected from a phosphine oxide compound.

TABLE 11

External quantum efficiency (EQE) and lifetime of bottom emission OLEDs with two ETLs

| | ETL1 | wt.-% Li organic complex*[1] | d (ETL1)/ nm | ETL2 | wt.-% Metal dopant*[2] | d (ETL2)/ nm | V at 10 mA/cm$^2$/V | EQE/ % | LT/ h |
|---|---|---|---|---|---|---|---|---|---|
| Comparative example 6 | MX1:LiQ | 50 | 19 | MX1:Ca | 5 | 17 | 3.77 | 5.48 | 55 |
| Example 22 | MX10:LiQ | 50.5 | 11 | MX2:Mg | 5.4 | 26 | 3.4 | 7.6 | 20 |
| Example 23 | MX11:LiQ | 50 | 17 | MX2:Mg | 5.3 | 20 | 4.3 | 6.5 | 35 |

*[1] = the wt.-% of the matrix compound and the wt.-% of the lithium organic complex are in total 100 wt.-% based on weight of the ETL1
*[2] = the wt.-% of the matrix compound and the wt.-% of the elemental metal are in total 100 wt.-% based on weight of the ETL2

As can be seen in Table 11 above, the efficiency EQE for examples 22 and 23 are improved significantly compared to comparative example 6. In particular example 22, for first matrix compound selected from phenanthroline MX10 and second matrix compound selected from phosphine oxide MX2, very high efficiency EQE is obtained.

Bottom Emission Single OLED Devices b) Lifetime and efficiency improvement with three electron transport layers (ETL 1, ETL 2 and ETL 3)

a) A device is fabricated with three ETL layers. ETL 1 (closest to the emission layer) contains a matrix compound and a lithium halide or lithium organic complex. ETL 2 (adjacent to ETL 1) contains a matrix compound and elemental metal, for example Mg or Yb. ETL 3 (adjacent to ETL 2 and closest to the cathode) contains a matrix compound and the same lithium halide or lithium organic complex as used in ETL 1. An Al or Ag cathode is deposited on top. Preferably the same phosphine oxide based matrix compound is used in the three electron transport layers. The external quantum efficiency EQE is >5.5% and the LT is >70 h, see Table 12.

b) A device is fabricated with three ETL layers. ETL 1 (closest to the emission layer) contains a matrix compound and an elemental metal, for example Mg or Yb. ETL 2 (adjacent to ETL 1) contains a matrix compound and a lithium halide or lithium organic complex. ETL 3 (adjacent to ETL 2 and closest to the cathode) contains a matrix compound and the same elemental metal as used in ETL 1. An Al or Ag cathode is deposited on top. Preferably the same phosphine oxide based matrix compound is used in the three electron transport layers. The external quantum efficiency EQE is >5.5% and the LT is >70 h.

Top Emission Devices

Lifetime and Efficiency Improvement with Three Electron Transport Layers (ETL 1, ETL 2 and ETL 3)

A device is fabricated with three ETL layers. ETL 1 (closest to the emission layer) contains a matrix compound and a lithium halide or lithium organic complex. ETL 2 (adjacent to ETL 1) contains a matrix compound and magnesium. ETL 3 (adjacent to ETL 2 and closest to the cathode) contains a matrix compound and the same lithium halide or lithium organic complex as used in ETL 1. An Ag:Mg (10:90 vol.-%) cathode is deposited on top. Preferably the same phosphine oxide based matrix compound is used in the three electron transport layers. The external quantum efficiency EQE and lifetime LT are significantly improved over the comparative example 8, see Table 13.

TABLE 12

External quantum efficiency (EQE) and lifetime of bottom emission OLEDs with three ETLs and Al cathode

| | ETL1 | wt.-% Lithium organic complex *[1] | d (ETL1)/ nm | ETL2 | wt.-% Metal dopant *[2] | d (ETL2)/ nm | ETL3 | wt.-% Lithium organic complex *[3] | d (ETL3)/ nm | V at 10 mA/cm$^2$/V | EQE/ % | LT/ h |
|---|---|---|---|---|---|---|---|---|---|---|---|---|
| Comp. example 7 | MX1:LiQ | 50 | 19 | MX1:Ca | 5 | 17 | — | — | — | 3.8 | 5.5 | 55 |
| Example 24 | MX2:LiQ | 50 | 11 | MX2:Mg | 5.2 | 17 | MX2:LiQ | 50 | 11 | 3.9 | 6.5 | 70 |

*[1] = the wt.-% of the matrix compound and the wt.-% of the lithium organic complex are in total 100 wt.-% based on weight of the ETL1
*[2] = the wt.-% of the matrix compound and the wt.-% of the elemental metal are in total 100 wt.-% based on weight of the ETL2
*[3] = the wt.-% of the matrix compound and the wt.-% of the lithium organic complex are in total 100 wt.-% based on weight of the ETL3

TABLE 13

External quantum efficiency (EQE) and lifetime of top emission OLEDs with three ETLs

| | ETL1 | wt.-% Lithium organic complex *[1] | d (ETL1)/ nm | ETL2 | wt.-% Metal dopant *[2] | d (ETL2)/ nm | ETL3 | wt.-% Lithium organic complex *[3] | d (ETL3)/ nm | V at 10 mA/cm$^2$/V | EQE/ % | LT/ h |
|---|---|---|---|---|---|---|---|---|---|---|---|---|
| Comp. example 8 | — | — | — | MX2:Mg | 5.1 | 36 | — | — | — | 3.8 | 6.9 | 53 |
| Example 25 | MX2:LiQ | 49.5 | 10 | MX2:Mg | 5 | 16 | MX2:LiQ | 49.5 | 11 | 3.6 | 10.2 | 70 |

*[1] = the wt.-% of the matrix compound and the wt.-% of the lithium organic complex are in total 100 wt.-% based on weight of the ETL1
*[2] = the wt.-% of the matrix compound and the wt.-% of the elemental metal are in total 100 wt.-% based on weight of the ETL2
*[3] = the wt.-% of the matrix compound and the wt.-% of the lithium organic complex are in total 100 wt.-% based on weight of the ETL3

Bottom Emission Tandem OLED Devices
General Procedure for OLEDs with Two Emission Layers (Tandem OLED)

For bottom emission devices, a 15 Ω/cm² glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

For top emission devices, the anode electrode was formed from 100 nm silver on glass which was prepared by the same methods as described above.

Then, 92 wt.-% of Biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 135 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 25 nm.

Then the ETL-layer stack is formed by depositing the first electron transport layer (ETL 1) including a matrix compound according to Example 26 to Example 28 by deposing the matrix compound from a first deposition source and the lithium organic complex or lithium halide of from a second deposition source directly on the EML.

Then the second electron transport layer (ETL 2) including a matrix compound according to Example 26 to Example 28 and comparative example 9 is formed by deposing the matrix compound from a first deposition source, if the same matrix compound is used as in the first electron transport layer, or a third deposition source, if the matrix compound is different from the matrix compound used in the first electron transport layer. 92 wt.-% of Biphenyl-4-yl(9,9-diphenyl-9H-fluoren-2-yl)-[4-(9-phenyl-9H-carbazol-3-yl)phenyl]-amine and 8 wt.-% of 2,2',2"-(cyclopropane-1,2,3-triylidene)tris(2-(p-cyanotetrafluorophenyl)acetonitrile) was vacuum deposited on the second electron transport layer (ETL 2), to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 30 nm. Then N3,N3'-di([1,1'-biphenyl]-4-yl)-N3,N3'-dimesityl-[1,1'-biphenyl]-3,3'-diamine (CAS 1639784-29-4) was vacuum deposited on the HTL to form a triplet control layer having a thickness of 15 nm. 90 wt.-% EL-GHB914S (Samsung SDI) as a host and 10 wt.-% EL-GD0108S (Samsung SDI) as phosphorescent green emitter are vacuum deposited on the triplet control layer, to form a green emitting EML having a thickness of 30 nm. MX 11 is vacuum deposited on the green emitting EML, to form an electron transport layer (ETL) having a thickness of 35 nm. LiQ is vacuum deposited on the ETL to form an electron injection layer (EIL) having a thickness of 2 nm. Aluminium is vacuum deposited on the EIL to form a cathode having a thickness of 100 nm.

The OLED stack is protected from ambient conditions by encapsulation of the device with a glass slide. Thereby, a cavity is formed, which includes a getter material for further protection.

The performance is assessed as described in the general procedure for single OLEDs.

In Table 14 below the performance of tandem OLEDs with a first and second ETL, wherein the first ETL comprises a Li organic complex and the second ETL comprises a metal dopant compared to comparative example 9 with a single ETL comprising a metal dopant.

The examples 26 to 28 in Table 14 comprise the charged generation layer without an interlayer (IL). In more detail, the tandem OLEDs according to Table 14 comprises a layer structure in the following order:

Substrate 110/anode electrode 120/first hole injection layer 130/first hole transport layer 140/first emission layer (fluorescent blue emitting layer) 150/first electron transport layer 161/second electron transport layer 162/second hole injection layer 131/second hole transport layer 141/triplet control layer 170/second emission layer (phosphorescent green emitting layer) 151/third electron transport layer 163/electron injection layer 180/ and a cathode electrode 190.

TABLE 14

External quantum efficiency (EQE) and lifetime of bottom emission tandem OLEDs with two ETLs and two emission layers

| | ETL1 | wt.-% Li organic complex *¹ | d (ETL1)/ nm | ETL2 | wt.-% Metal dopant *² | vol.-% Metal dopant *³ | d (ETL2)/ nm | V at 10 mA/cm²/V | EQE/ % | LT/ h |
|---|---|---|---|---|---|---|---|---|---|---|
| Comp. exa. 9 | — | — | — | MX4:Yb | 5 | 1 | 30 | 6.9 | 22.7 | 45 |
| Exa. 26 | MX4:Li-2 | 50 | 14 | MX4:Yb | 5 | 1 | 16 | 8.2 | 25.5 | 82 |
| Exa. 27 | MX4:Li-2 | 50 | 14 | MX4:Li | 0.5 | 1 | 16 | 7.8 | 25.9 | 60 |
| Exa. 28 | MX4:Li-2 | 49 | 13 | MX10:Li | 0.5 | 1 | 17 | 7.9 | 24.6 | 64 |

*¹ = the wt.-% of the matrix compound and the wt.-% of the lithium organic complex are in total 100 wt.-% based on weight of the ETL1
*² = the wt.-% of the matrix compound and the wt.-% of the elemental metal are in total 100 wt.-% based on weight of the ETL2
*³ = the vol.-% of the matrix compound and the vol.-% of the elemental metal are in total 100 vol.-% based on weight of the ETL2

As can be seen in Table 14 above, the performance is compared of Example 26 with a first ETL comprising a phosphine oxide matrix compound and a Li organic complex and comparative example 9 without first ETL. Efficiency and LT are significantly improved, thereby demonstrating the benefit of devices comprising a first ETL.

In Example 26, Li is used as metal dopant compared to Yb dopant in Example 27. The same volume percentage of metal dopant is used for both examples. Comparable LT and efficiency are achieved for these different metal dopants.

In Example 28, a phenanthroline matrix compound, MX 10, is used in the second ETL. Efficiency and LT are comparable to Example 27, where a phosphine oxide matrix compound, MX 4, was used.

In conclusion, high efficiency and LT are obtained for tandem OLED devices which comprise a first and second ETL.

The double ETL of a first electron transport layer and of a second electron transport layer as well as the triple ETL of a first electron transport layer, a second electron transport layer and a third electron transport layer could also be employed for other emission colors, for example green, red, and white-light emitting devices.

Another aspect is directed to a device comprising at least one organic light-emitting diode (OLED). A device comprising organic light-emitting diodes is for example a display or a lighting panel.

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. An organic light-emitting diode (OLED) comprising an emission layer and an electron transport layer stack of at least two electron transport layers, wherein a first electron transport layer and a second electron transport layer comprise at least one matrix compound, wherein the first electron transport layer comprises a first matrix compound, and the second electron transport layer comprises a second matrix compound that is a phosphine oxide based compound; and in addition,
the at least first electron transport layer comprises a lithium halide or a lithium organic complex; and the at least second electron transport layer comprises an elemental metal selected from the group of lithium, magnesium and/or ytterbium;
wherein the electron transport layer or layers comprising a lithium halide or a lithium organic complex is free of an elemental metal, and the electron transport layer or layers that comprises an elemental metal is free of a metal salt and/or a metal organic complex;
wherein for an electron transport layer stack of two electron transport layers the first electron transport layer is arranged closest to at least one emission layer, and the second electron transport layer is arranged closest to a cathode electrode.

2. An organic light-emitting diode (OLED) according to claim 1, wherein the matrix compounds of the electron transport layer stack are different for each electron transport layer, except for the phosphine oxide matrix compound.

3. The OLED comprising the electron transport layer stack according to claim 1, wherein
the amount of the lithium halide or lithium organic complex in an electron transport layer is in the range of about >10 mol-% to about <95 mol-% of the corresponding electron transport layer; and/or
the amount of the lithium halide or lithium organic complex in an electron transport layer stack of at least three electron transport layers, and/or at least two of the electron transport layers is in the range of about >10 mol-% to about <95 mol-% of the corresponding electron transport layer.

4. The OLED comprising the electron transport layer stack according to claim 1, wherein
at least one electron transport layer, comprises about >1 wt.-% to about <60 wt.-% of an elemental metal selected from the group of lithium, magnesium and/or ytterbium; or
at least two electron transport layer of at least three electron transport layers comprises about >1 wt.-% to about <60 wt.-% of an elemental metal selected from the group of lithium, magnesium and/or ytterbium; wherein the weight percent of the elemental metal selected from the group of lithium, magnesium and/or ytterbium is based on the total weight of the corresponding electron transport layer.

5. The OLED comprising the electron transport layer stack according to claim 1, wherein the lithium halide is selected from a group comprising LiF, LiCl, LiBr or LiI, and the organic ligand of the lithium organic complex is a quinolate, a borate, a phenolate, a pyridinolate or a Schiff base ligand.

6. The OLED comprising the electron transport layer stack according to claim 1, wherein the electron transport layer stack comprises at least two electron transport layers or at least three electron transport layers, and wherein each electron transport layer comprises at least one matrix compound, whereby the matrix compound of the electron transport layers are selected same or different.

7. The OLED comprising the electron transport layer stack according to claim 1, wherein the at least two electron transport layers or at least three electron transport layers comprise at least one matrix compound, whereby the matrix compound of the electron transport layers are selected same or different, and wherein the first matrix compound is selected from:
an anthracene based compound or a heteroaryl substituted anthracene based compound;
a phosphine oxide based compound; or
a substituted phenanthroline compound.

8. The OLED comprising the electron transport layer stack according to claim 1, wherein the thicknesses of each electron transport layer are same or each independently in the range of about >0.5 nm to about <95 nm.

9. The OLED comprising the electron transport layer stack according to claim 1, wherein the thicknesses of the electron transport layer stack is in the range of about >25 nm to about <100 nm.

10. The OLED comprising the electron transport layer stack according to claim 1, wherein the electron transport layer stack has two to four electron transport layers.

11. The OLED comprising the electron transport layer stack according to claim 1, wherein the at least second electron transport layer is formed directly on the at least first electron transport layer and/or an at least third electron transport layer is formed directly on the at least second electron transport layer so that the second electron transport layer is sandwiched between the first electron transport layer and the third electron transport layer.

12. The OLED comprising the electron transport layer stack according to claim 1, wherein
at least one electron transport layer or in case of at least three electron transport layers at least two electron transport layer comprise: a) about >10 wt.-% to about <70 wt.-% of a lithium halide, selected from the group comprising a LiF, LiCl, LiBr or LiI, or of a lithium organic complex, selected from the group comprising a lithium quinolate, a borate, a phenolate, a pyridinolate or a Schiff base ligand;
b) about <90 wt.-% to about >30 wt.-% of a matrix compound of:
an anthracene based compound or a heteroaryl substituted anthracene based compound;
a phosphine oxide based compound;
a substituted phenanthroline compound; and
at least one electron transport layer or in case of at least three electron transport layers at least two electron layers comprise:

c) about >1 wt.-% to about <60 wt.-% of an elemental metal selected from the group of lithium, magnesium and/or ytterbium;

d) about <99 wt.-% to about >40 wt.-% of a matrix compound of:
a phosphine oxide based compound.

13. The OLED comprising the electron transport layer stack according to claim 1, wherein
the at least one lithium organic complex containing electron transport layer comprises of about >50 wt.-% to about <60 wt.-% of a lithium 8-hydroxyquinolate and about <50 wt.-% to about >40 wt.-% of a (3-(dibenzo[c,h]acridin-7-yl)phenyl)diphenylphosphine oxide; and
the at least one elemental metal containing electron transport layer comprises of about >2 wt.-% to about <45 wt.-% of an elemental metal selected from the group of lithium, magnesium and/or ytterbium.

14. The OLED according to claim 1 comprising: a substrate; a first anode electrode is formed on the substrate; the cathode electrode is formed on the at least first anode electrode; and the electron transport layer stack arranged between the at least first anode electrode and the cathode electrode, comprising or consisting of the at least two electron transport layers or of at least three electron transport layers.

15. The OLED according to claim 1, further comprising at least one layer selected from the group consisting of a hole injection layer, a hole transport layer and a hole blocking layer, arranged between an at least first anode electrode and the electron transport layer stack.

16. The OLED according to claim 1, further comprising an electron injection layer arranged between the electron transport layer stack and the cathode electrode.

17. The OLED according to claim 1, comprising the following layers arranged in the order of a substrate, an anode electrode, a first hole injection layer, a first hole transport layer, optional a first triplet control layer, a first emission layer, the first electron transport layer, the second electron transport layer, an optional interlayer, a second hole injection layer, a second hole transport layer, optional a second triplet control layer, a second emission layer, an optional electron transport layer, optional a third electron transport layer, an optional injection layer, and the cathode electrode.

18. A method of manufacturing an organic light-emitting diode according to claim 1, the method comprising:
deposition via at least three deposition sources; or
deposition via vacuum thermal evaporation; or
deposition via solution processing.

19. A method of manufacturing an organic light-emitting diode according to claim 18, the method comprising:
a first or a first and a fourth deposition source to release the matrix compound, and
a second deposition source to release lithium halide or lithium organic complex, and
a third deposition source to release the elemental metal,
at least one or two deposition sources to release the matrix compound, and
at least one or two deposition sources to release lithium halide or lithium organic complex, and
the method comprising the steps of forming the electron transport layer stack; whereby
a first electron transport layer is formed by releasing the matrix compound from at least one deposition source and a lithium halide or a lithium organic complex or an elemental metal is released from at different deposition source;

onto the first electron transport layer a second electron transport layer is formed by releasing the matrix compound from at least one deposition source and a lithium halide or a lithium organic complex or an elemental metal is released from at different deposition source;

onto the second electron transport layer a third electron transport layer is formed by releasing the matrix compound from at least one deposition source and a lithium halide or a lithium organic complex or an elemental metal is released from at different deposition source;
whereby
at least one electron transport layer comprises a lithium halide or a lithium organic complex and is free of an elemental metal; and at least one electron transport layer comprises an elemental metal and is free of a lithium halide or a lithium organic complex.

20. The method of claim 18, comprising the steps, wherein
on a substrate a first anode electrode is formed,
on the first anode electrode an emission layer is formed,
on the emission layer an electron transport layer stack is formed,
comprising at least two electron transport layers, or at least three electron transport layers,
on the electron transport layer stack a second cathode electrode is formed,
optional a hole injection layer, a hole transport layer, an emission layer, and a hole blocking layer, are formed in that order between the at least first anode electrode and the electron transport layer stack,
optional an electron injection layer is arranged between the electron transport layer stack and the at least second cathode electrode.

21. A device comprising at least one organic light-emitting diode of claim 1.

22. The OLED comprising at least one emission layer, and an electron transport layer stack of at least two electron transport layers according to claim 1, wherein the phosphine oxide based compound is selected from (3-(dibenzo[c,h]acridin-7-yl)phenyl)diphenylphosphine oxide, 3-phenyl-3H-benzo[b][dinaphtho[2,1-d: 1',2'-f]phosphepine-3-oxide, bis(4-(anthracen-9-yl)phenyl)(phenyl)phosphine oxide, phenyldi(pyren-1-yl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl[-3-yl)phosphine oxide, diphenyl(4'-(pyren-1-yl)-[1,1'-biphenyl[-3-yl)phosphine oxide, (3'-(dibenzo[c,h[acridin-7-yl)-[1,1'-biphenyl[-4-yl)diphenylphosphine oxide, or phenyl bis(3-(pyren-1-yl)phenyl)phosphine oxide.

23. The OLED comprising the electron transport layer stack according to claim 5, wherein the lithium quinolate complex has the formula I, II, or III:

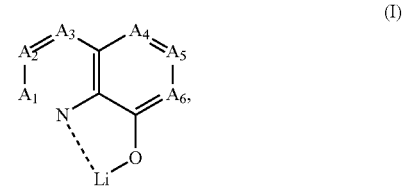

-continued (II)

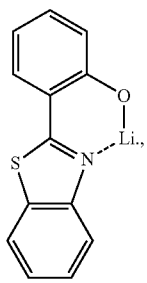

(III)

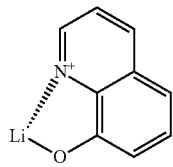

wherein
A1 to A6 are same or independently selected from CH, CR, N, O;
R is same or independently selected from hydrogen, halogen, alkyl or aryl or heteroaryl with 1 to 20 carbon atoms.

24. The OLED comprising the electron transport layer stack according to claim 5, wherein the borate based organic ligand is a tetra(1H-pyrazol-1-yl)borate.

25. The OLED comprising the electron transport layer stack according to claim 5, wherein the phenolate is a 2-(pyridin-2-yl)phenolate, a 2-(diphenylphosphoryl)phenolate, an imidazol phenolate, 2-(pyridin-2- yl)phenolate, or 2-(1-phenyl-1H-benzo[d]imidazol-2-yl)phenolate.

26. The OLED comprising the electron transport layer stack according to claim 5, wherein the pyridinolate is a 2-(diphenylphosphoryl)pyridin-3-olate.

27. The OLED comprising the electron transport layer stack according to claim 5, wherein the lithium Schiff base has the structure 100, 101, 102 or 103:

100

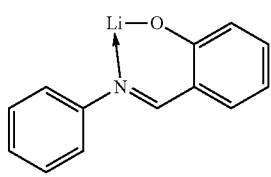

101

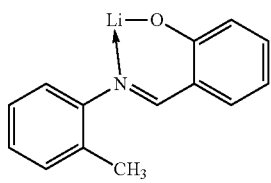

102

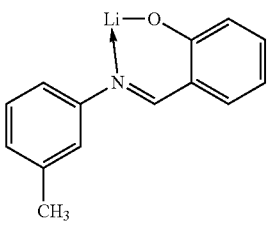

103

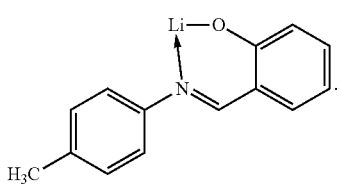

28. The OLED comprising the electron transport layer stack according to claim 7, wherein the anthracene based compound or the heteroaryl substituted anthracene based compound is selected from 2-(4-(9, 10-di(naphthalen-2-yl) anthracene-2-yl)phenyl)-1- phenyl-1H-benzo[d] imidazole, 1-(4-(10-([1, 1'-biphenyl[-4-yl)anthracen-9-yl)phenyl)-2-ethyl-1H-benzo[d[imidazole, or N4,N4"-di(naphthalen-1-yl)-N4,N4"-diphenyl-[1, 1:4',1"-terphenyl]-4,4"-diamine.

29. The OLED comprising the electron transport layer stack according to claim 7, wherein the phosphine oxide based compound is selected from (3-(dibenzo[c,h[acridin-7-yl)phenyl)diphenylphosphine oxide, 3-phenyl-3H-benzo [b[dinaphtho[2,1-d: 1 2'4] phosphepine-3-oxide, bis(4-(anthracen-9-yl)phenyl)(phenyl)phosphine oxide, phenyldi (pyren-1-yl)phosphine oxide, (3-(9,10-di(naphthalen-2-yl) anthracen-2-yl)phenyl)diphenylphosphine oxide, phenyldi (pyren-1-yl)phosphine oxide, diphenyl(5-(pyren-1-yl) pyridin-2-yl)phosphine oxide, diphenyl(4'-(pyren-1-yl)-[1, 1'-biphenyl[-3-yl)phosphine oxide, diphenyl(4'-(pyren-1-yl)-[1,1'-biphenyl]-3-yl)phosphine oxide, (3'-(dibenzo[c,h [acridin-7-yl)-[1,1'-biphenyl]-4-yl)diphenylphosphine oxide, or phenyl bis(3-(pyren-1-yl)phenyl)phosphine oxide.

30. The OLED comprising the electron transport layer stack according to claim 7, wherein the substituted phenanthroline compound is selected from 2,4,7,9-tetraphenyl-1, 10-phenanthroline, 4,7-diphenyl-2,9-di-p-tolyl-1, 10-phenanthroline, or 2,9-di(biphenyl-4-yl)-4,7-diphenyl-1, 10-phenanthroline.

* * * * *